(12) United States Patent
Odagawa et al.

(10) Patent No.: US 6,839,273 B2
(45) Date of Patent: Jan. 4, 2005

(54) MAGNETIC SWITCHING DEVICE AND MAGNETIC MEMORY USING THE SAME

(75) Inventors: Akihiro Odagawa, Tsuchiura (JP); Nozomu Matsukawa, Nara (JP); Yasunari Sugita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/783,286

(22) Filed: Feb. 20, 2004

(65) Prior Publication Data

US 2004/0165428 A1 Aug. 26, 2004

Related U.S. Application Data

(63) Continuation of application No. PCT/JP03/16519, filed on Dec. 24, 2003.

(30) Foreign Application Priority Data

Dec. 25, 2002 (JP) ....................................... 2002-374388
Sep. 17, 2003 (JP) ....................................... 2003-324405

(51) Int. Cl.$^7$ ............................................. G11C 11/14
(52) U.S. Cl. ...................... 365/171; 365/158; 365/174
(58) Field of Search ........................ 365/97, 157, 158, 365/171–173; 428/692, 693, 694 R

(56) References Cited

U.S. PATENT DOCUMENTS

2003/0151944 A1   8/2003   Saito

FOREIGN PATENT DOCUMENTS

JP       2003-92440       3/2003

OTHER PUBLICATIONS

Ohno et al., "Electric–field control of ferromagnetism", NATURE, vol. 408, Dec. 2000, pp. 944–946.

*Primary Examiner*—Ramon M. Barrera
(74) *Attorney, Agent, or Firm*—Merchant & Gould P.C.

(57) ABSTRACT

A magnetic switching device is provided, which has a configuration different from that of a conventional example and is capable of enhancing an energy conversion efficiency for changing the magnetized state of a magnetic substance. A magnetic memory using the magnetic switching device also is provided The magnetic switching device includes a magnetic layer, a transition layer magnetically coupled to the magnetic layer, and a carrier supplier including at least one selected from metal and a semiconductor. The transition layer and the carrier supplier are placed in such a manner that a voltage can be applied between the transition layer and the carrier supplier. The transition layer undergoes a non-ferromagnetism—ferromagnetism transition by the application of a voltage, and the magnetized state of the magnetic layer is changed by the transition of the transition layer.

21 Claims, 12 Drawing Sheets

$V_g \neq 0$

MAGNETIC SWITCHING DEVICE AND MAGNETIC MEMORY USING THE SAME

BACKGROUND OF THE INVENTION

1. Field of the Invention

The present invention relates to a magnetic switching device and a magnetic memory using the same.

2. Description of the Related Art

Magnetic switching devices including a magnetic substance, for performing conversion between electric energy and magnetic energy, are used for various magnetic devices such as a reproducing head of a magnetic recording apparatus, sensors (e.g., a force sensor, an acceleration sensor, etc.), and magnetic solid memories (e.g., a magnetic random access memory, etc.). However, such a magnetic switching device has a problem of a low energy conversion efficiency as described below, and hence, there is a demand for a magnetic switching device with a higher energy conversion efficiency (i.e., with reduced power consumption).

As a method for controlling a magnetic switching device, for example, the magnetized state of a magnetic substance included in a magnetic switching device is changed, and as a more specific example, the magnetization direction of the magnetic substance is reversed. The magnetized state of a magnetic substance generally is known to be determined by the sum of exchange energy, crystal magnetic anisotropic energy, magnetostatic energy, and Zeeman energy generated by an external magnetic field. Among them, the physical amounts that can be controlled so as to change the magnetized state are magnetostatic energy and Zeeman energy. Therefore, in the case of controlling the magnetized state of a magnetic substance with electric energy, an external magnetic field generated when a current flows has been used conventionally. However, for example, the energy conversion efficiency for generation of a magnetic field with a line current is about 1%. Furthermore, in the case of the line current, the intensity of a generated magnetic field is inversely proportional to a distance. In most cases, it is necessary to place an insulator between a lead through which a line current is allowed to flow and a magnetic substance in a magnetic switching device. Therefore, it is considered that the energy conversion efficiency is decreased to a level less than 1%. Such a low energy conversion efficiency is considered to be a factor that prevents a magnetic switching device and a magnetic device using the magnetic switching device from further spreading.

SUMMARY OF THE INVENTION

Therefore, with the foregoing in mind, it is an object of the present invention to provide a magnetic switching device capable of enhancing an energy conversion efficiency for changing the magnetized state of a magnetic substance by using a configuration different from a conventional configuration, and a magnetic memory using the magnetic switching device.

A magnetic switching device of the present invention includes: a magnetic layer; a transition layer magnetically coupled to the magnetic layer; and a carrier supplier containing at least one material selected from metal and a semiconductor. The transition layer and the carrier supplier are placed in such a manner that a voltage can be applied between the transition layer and the carrier supplier. The transition layer undergoes a non-ferromagnetism—ferromagnetism transition by application of the voltage, and a magnetized state of the magnetic layer is changed by the transition of the transition layer.

Herein, the transition layer may undergo the transition when carriers selected from electrons and holes are injected to the transition layer from the carrier supplier under the application of the voltage.

Furthermore, the transition layer may undergo the transition when carriers selected from electrons and holes are induced to the transition layer under the application of the voltage.

Next, a magnetic memory of the present invention includes: a plurality of the above-mentioned magnetic switching devices further including a detecting portion for detecting a change in a magnetized state of the magnetic layer; an information recording lead for recording information in the magnetic switching device; and an information reading lead for reading the information.

These and other advantages of the present invention will become apparent to those skilled in the art upon reading and understanding the following detailed description with reference to the accompanying figures.

DESCRIPTION OF THE PREFERRED EMBODIMENTS

Figure 1:
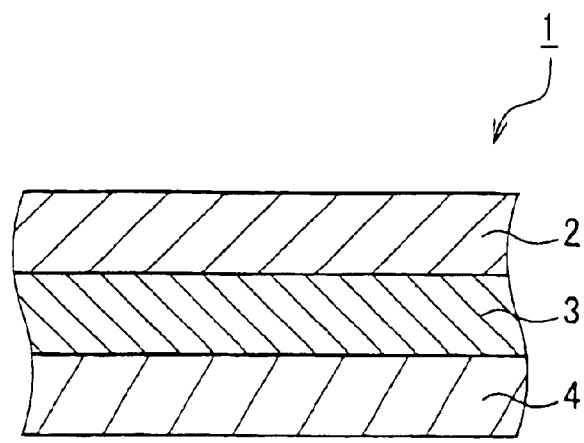
FIG. 1 is a schematic view showing an exemplary magnetic switching device of the present invention.

Hereinafter, the present invention will be described by way of embodiments with reference to the drawings. In the following embodiments, like components are denoted with like reference numerals, and the overlapping description may be omitted.

First, a magnetic switching device of the present invention will be described.

A magnetic switching device 1 shown in FIG. 1 includes a magnetic layer 2, a transition layer 3 magnetically coupled to the magnetic layer 2, and a carrier supplier 4 containing at least one material selected from metal and a semiconductor. The transition layer 3 and the carrier supplier 4 are placed in such a manner that a voltage can be applied therebetween. For example, in the magnetic switching device 1 shown in FIG. 1, the carrier supplier 4, the transition layer 3, and the magnetic layer 2 are laminated successively. Herein, the transition layer 3 undergoes a non-ferromagnetism—ferromagnetism transition by a voltage applied between the transition layer 3 and the carrier supplier 4. The magnetic layer 2 is magnetically coupled to the transition layer 3, so that the magnetized state of the magnetic layer 2 can be changed by the non-ferromagnetism—ferromagnetism transition of the transition layer 3. More specifically, by applying a voltage between the transition layer 3 and the carrier supplier 4, the magnetized state of the magnetic layer 2 can be changed Thus, in the magnetic switching device 1 of the present invention, conversion between electric energy and magnetic energy can be performed.

The transition layer 3 may undergo the above-mentioned transition, for example, when carriers selected from electrons and holes are injected from the carrier supplier 4 to the transition layer 3 as a result of the application of a voltage between the transition layer 3 and the carrier supplier 4. Furthermore, the transition layer 3 may undergo the above-mentioned transition, for example, when the above-mentioned carriers are induced to the transition layer 3 when the above-mentioned voltage is applied. Specific materials that can be used for the transition layer 3 will be described later. The term "apply a voltage" as used herein refers to a voltage being applied between the transition layer 3 and the carrier supplier 4, unless otherwise specified.

In the magnetic switching device 1, the magnetized state of the magnetic layer 2 can be changed with smaller electric power, compared with the case where the magnetized state of a magnetic layer is changed by introducing a magnetic field generated by a line current to a magnetic layer as in a conventional example. Thus, the magnetic switching device 1 with a high conversion efficiency between electric energy and magnetic energy (with reduced power consumption) can be obtained.

In the magnetic switching device 1 of the present invention, the change in the magnetized state of the magnetic layer 2 may be, for example, a change in the magnetization direction of the magnetic layer 2. There is no particular limit to the degree of the change in the magnetization direction. In terms of an efficiency at which the change in the magnetization direction of the magnetic layer 2 is read, it is preferable that the magnetization direction of the magnetic layer 2 is reversed by the transition of the transition layer 3.

Figure 2A:
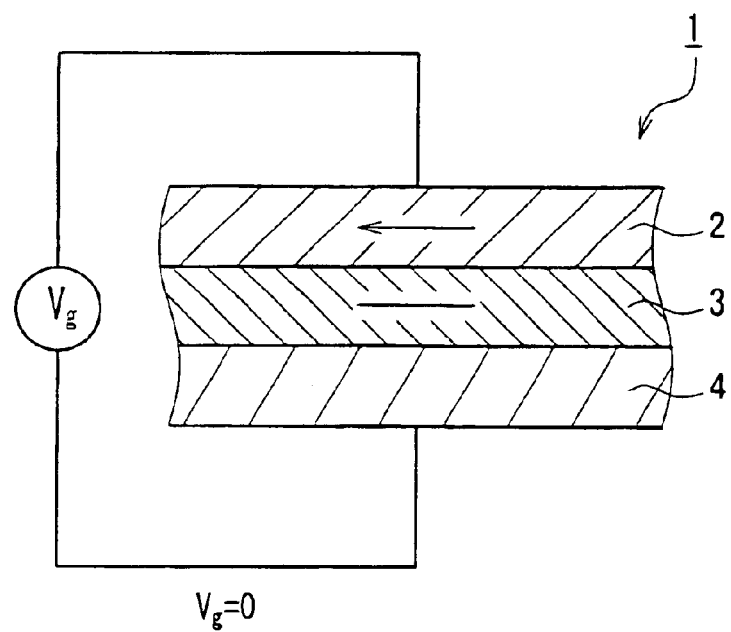
FIGS. 2A and 2B are schematic views showing an exemplary change in a magnetized state of a magnetic layer in the magnetic switching device of the present invention.
Figure 2B:
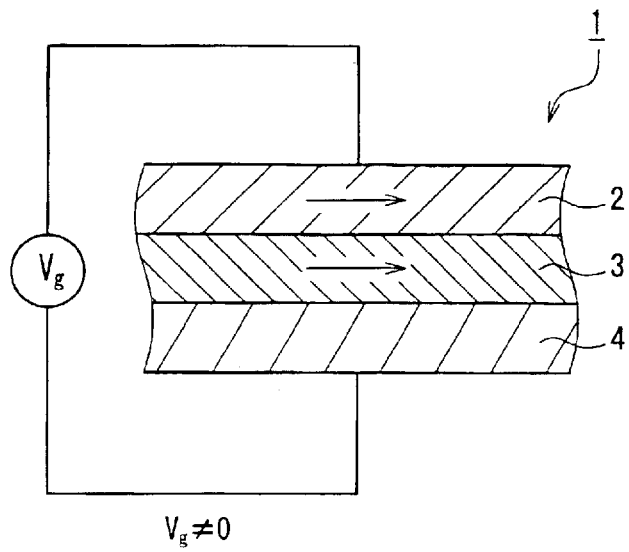

A specific example of the change in the magnetized state of the magnetic layer 2 will be described with reference to FIGS. 2A and 2B. In the magnetic switching device 1 shown in FIGS. 2A and 2B, a wire is connected to the magnetic layer 2 and the carrier supplier 4, whereby a voltage $V_g$ can be applied between the transition layer 3 and the carrier supplier 4. The transition layer 3 transitions from a paramagnetic state to a ferromagnetic state by the injection or induction of carriers. As shown in FIG. 2A, when $V_g=0$, the transition layer 3 is in a paramagnetic state, and the magnetization direction of the magnetic layer 2 is directed in a predetermined direction (e.g., in a direction of an axis of easy magnetization). Herein, as shown in FIG. 2B, when the voltage $V_g$ ($V_g \neq 0$) is applied between the transition layer 3 and the carrier supplier 4, for example, carriers are injected or induced to the transition layer 3, whereby the transition layer 3 transitions from a paramagnetic state to a ferromagnetic state to have a constant magnetization direction. Since the magnetic layer 2 and the transition layer 3 are magnetically coupled to each other, the magnetization direction of the magnetic layer 2 changes so as to be in parallel with that of the transition layer 3, along with the transition of the transition layer 3. At this time, if the above-mentioned predetermined direction in the magnetic layer 2 is set to be antiparallel with the magnetization direction expressed the transition layer 3 when the transition layer 3 is in a ferromagnetic state, the magnetization direction of the magnetic layer 2 can be reversed by the transition of the transition layer 3. That is, the application of the voltage $V_g$ ($V_g \neq 0$) can reverse the magnetization direction of the magnetic layer 2. In FIGS. 2A and 2B, the magnetization direction of each layer is represented schematically by an arrow. This also applies to the subsequent figures.

The non-ferromagnetism—ferromagnetism transition of the transition layer 3 will be described. The non-ferromagnetism—ferromagnetism transition is not particularly limited, as long as it is a magnetic transition that changes reversibly or with hysteresis between the state other than a ferromagnetic state (e.g., an antiferromagnetic state, a non-magnetic state, a paramagnetic state) and the ferromagnetic state. The transition layer 3 may transition from a non-ferromagnetic state to a ferromagnetic state, or from a ferromagnetic state to a non-ferromagnetic state when a voltage is applied (e.g., when carriers are injected or induced). In any case, for example, by previously setting the magnetization direction of the transition layer 3 in a ferromagnetic state and the magnetization direction of the magnetic layer 2 when the transition layer 3 is in a non-ferromagnetic state, the magnetization direction of the magnetic layer 2 can be reversed by the application of a voltage.

Above all, in terms of energy required for a transition, a paramagnetism—ferromagnetism transition (a magnetic transition that changes reversibly or with hysteresis between a paramagnetic state and a ferromagnetic state), or a non-magnetism—ferromagnetism transition (a magnetic transition that changes reversibly or with hysteresis between a non-magnetic state and a ferromagnetic state) is preferable. In particular, the paramagnetism—ferromagnetism transition is preferable. If the transition layer 3 that undergoes such a transition is used, the energy required for the transition can be reduced, which enables a magnetic switching device with a higher energy conversion efficiency to be obtained.

More specifically, the transition layer 3 may transition from a paramagnetic state to a ferromagnetic state when a voltage is applied. In other words, when a voltage is not applied, the transition layer 3 may be in a paramagnetic state or a non-magnetic state (a paramagnetic state is preferable), and when a voltage is applied, the transition layer 3 may be in a ferromagnetic state.

Figure 3:
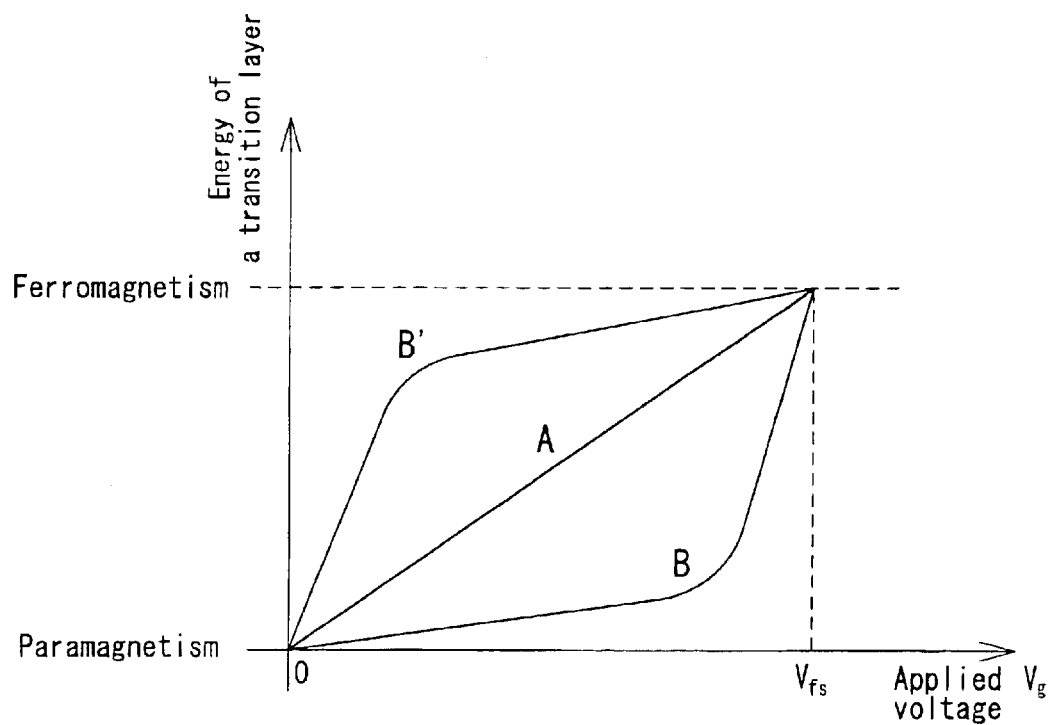
FIG. 3 is a schematic view illustrating an exemplary magnetic transition in a transition layer of the magnetic switching device of the present invention.

FIG. 3 shows an example of a change in the magnetic state of the transition layer 3. In the example shown in FIG. 3, as the applied voltage $V_g$ is increased from a paramagnetic state ($V_g=0$) (e.g., as carriers are injected or induced), the magnetic state of the transition layer changes from a paramagnetic state to a ferromagnetic state. Furthermore, in contrast, as an applied voltage is decreased from a ferromagnetic state ($V_g=V_{fs}$), the magnetic state of the transition layer changes from a ferromagnetic state to a paramagnetic state. The change in the magnetic state may be linear as represented by a line A shown in FIG. 3 or non-linear as represented by a curve B, and the applied voltage $V_g$ may have a threshold value. Furthermore, the magnetic state may follow the curve B in one change and follow a curve B' in the other change. Thus, the change in the magnetic state may have hysteresis.

A method for arranging the magnetic layer 2, the transition layer 3, and the carrier supplier 4 in the magnetic switching device 1 of the present invention will be described. A specific arrangement method of each of the above-mentioned layers is not particularly limited, as long as a voltage can be applied between the transition layer 3 and the carrier supplier 4, and the transition layer 3 and the magnetic layer 2 can be magnetically coupled to each other. For example, as in the example shown in FIG. 1, the transition layer 3, the magnetic layer 2, and the carrier supplier 4 may be arranged so that the transition layer 3 is interposed between the magnetic layer 2 and the carrier supplier 4. Another layer may be placed between the above-mentioned respective layers, if required.

There is no particular limit to the relative position between the carrier supplier 4 and the transition layer 3, the contact state (or a junction state) therebetween in the case where they are in contact, and the like, as long as carriers, for example, can be injected or induced when a voltage is applied. Above all, in the case where the transition layer 3 and the carrier supplier 4 are made of semiconductors, the junction interface therebetween preferably is in a P-N junction state or in a state similar to the P-N junction. Furthermore, the above-mentioned junction interface may be in a two-dimensional electron gas state. When a voltage is applied, carriers can be injected or induced with smaller power consumption. In particular, it is preferable that the carrier supplier 4 and the transition layer 3 are selected to be joined to each other so that carriers move in an avalanche manner when the carriers are injected from the carrier supplier 4 to the transition layer 3. In the magnetic switching device 1 having such a P-N junction, it can be said that the magnetized state of the magnetic layer 2 can be changed by applying a voltage to a junction body of the transition layer 3 and the carrier supplier 4.

Figure 4:
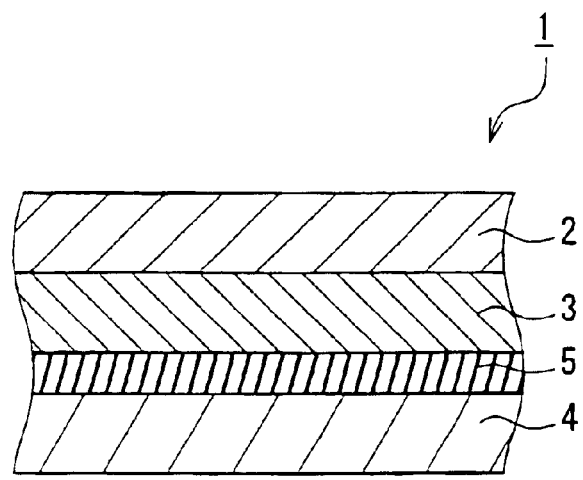
FIG. 4 is a schematic view showing another exemplary magnetic switching device of the present invention.

FIG. 4 shows another example of the magnetic switching device 1 of the present invention. In the magnetic switching device 1 shown in FIG. 4, an insulating layer (Ilayer) 5 is placed between the transition layer 3 and the carrier supplier 4 of the magnetic switching device 1 shown in FIG. 1. In this case, by selecting the material to be used for the insulating layer 5 and/or the configuration of the insulating layer 5, a magnetic switching device 1 with a higher energy conversion efficiency can be obtained. Particularly, in the case where the transition layer 3 and the carrier supplier 4 are made of p-type or n-type semiconductors having different types, it is preferable that the junction interface between the transition layer 3 and the carrier supplier 4 is in a P-I-N junction state or a state similar to the P-I-N junction. The I layer may be, for example, a Schottky barrier. In the case where the transition layer 3 is made of a semiconductor, and the carrier supplier 4 is made of metal, the junction interface between the transition layer 3 and the carrier supplier 4 preferably is in a so-called M-I-S junction state, or a state similar to the M-I-S junction. In these cases, carriers can be injected or induced with smaller power consumption when a voltage is applied. It is preferable that the carrier supplier 4 and the transition layer 3 are selected to be joined to each other so that carriers move in an avalanche manner from the carrier supplier 4 to the transition layer 3 even in the presence of the I layer. In the magnetic switching device 1 having a P-I-N junction or an M-I-S junction, it also can be said that by applying a voltage to the junction body of the transition layer 3, the insulating layer 5, and the carrier supplier 4, the magnetized state of the magnetic layer 2 can be changed. Specific materials used for the insulating layer 5 will be described later.

There is no particular limit to the material used for the transition layer 3, as long as it undergoes a non-ferromagnetism—ferromagnetism transition when a voltage is applied (for example, when carriers are injected or induced). For example, the transition layer 3 may contain a magnetic semiconductor.

More specific materials for a magnetic semiconductor will be described below.

As a semiconductor to be a base material of a magnetic semiconductor, for example, a compound semiconductor may be used in terms of the induction of a magnetic transition of the transition layer 3. Specifically, magnetic semiconductors may be used, in which I-V group, I-VI group, II-IV group, II-V group, II-VI group, III-V group, III-VI group, IV-IV group, I-III-VI group, I-V-VI group, II-III-VI group, or II-IV-V group compound semiconductors such as GaAs, GaSe, AlAs, InAs, AlP, AlSb, GaP, GaSb, InP, InSb, $In_2Th_3$, ZnO, ZnS, ZnSe, ZnTe, CdSe, CdTe, CdSb, HgS, HgSe, HgTe, SiC, GeSe, PbS, $Bi_2Te_3$, $Sb_2Se_3$, $Mg_2Si$, $Mg_2Sn$, $Mg_3Sb_2$, $TiO_2$, $CuInSe_2$, $CuHgIn_4$, $ZnIn2Se_4$, $CdSnAs_2$, $AgInTe_2$, $AgSbSe_2$, GaN, AlN, GaAlN, BN, AlBN, and GaInNAs are used as a base material, and at least one element selected from the IVa group to VIII group, and IVb group is added to these compound semiconductors. The group denotation in the present specification is based on the prescription of IUPAC (1970).

Alternatively, a magnetic semiconductor having a composition represented by Formula: $Q^1Q^2Q^3$ may be used. Herein, $Q^1$ is at least one element selected from Sc, Y, a rare earth element (La, Ce, Pr, Nd, Sm, Eu, Gd, Tb, Dy, Ho, Er), Ti, Zr, Hf, V, Nb, Ta, Cr, Ni, and Zn. $Q^2$ is at least one element selected from V, Cr, Mn, Fe, Co, and Ni. $Q^3$ is at least one element selected from C, N, O, F, and S. There is no particular limit to the composition ratio among the elements $Q^1$, $Q^2$, and $Q^3$.

Alternatively, a magnetic semiconductor having a composition represented by Formula: $R^1R^2R^3$ may be used. Herein, $R^1$ is at least one element selected from B, Al, Ga, and In. $R^2$ is at least one element selected from N and P. $R^3$ is at least one element selected from IVa group to VIII group, and IVb group. There is no particular limit to the composition ratio among the elements $R^1$, $R^2$, and $R^3$.

Alternatively, a magnetic semiconductor having a composition represented by Formula: $ZnOR^3$ may be used. Herein, $R^3$ is the above-mentioned element $R^3$, Zn is zinc, and O is oxygen. There is no particular limit to the composition ratio among Zn, O, and the element $R^3$.

Alternatively, a magnetic semiconductor having a composition represented by Formula: $TOR^3$ may be used.

Herein, T is at least one element selected from Ti, Zr, V, Nb, Fe, Ni, Al, In, and Sn. $R^3$ is the above-mentioned element $R^3$, and O is oxygen. There is no particular limit to the composition ratio among the elements T and O, and the element $R^3$.

Furthermore, the transition layer 3 may contain an oxide, for example, having a composition represented by Formula: $A_xD_yO_z$. Herein, A is at least one element selected from alkali metal (Ia group), alkaline-earth metal (IIa group), Sc, Y, and a rare earth element (La, Ce, Pr, Nd, Sm, Eu, Gd, Tb, Dy, Ho, Er). D is at least one element selected from Va group, VIa group, VIIa group, and VIII group. O is oxygen. The above-mentioned oxides generally have a crystal structure in which the element D basically is at a central position in a unit cell of a corresponding crystal lattice, and an atom at the central position is surrounded by a plurality of oxygen atoms.

There is no particular limit to x, y, and z, as long as they are positive numbers. Above all, it is preferable that they are numerical values satisfying the combinations described below. The above-mentioned oxides can be classified into a plurality of categories based on the combination. The transition layer 3 may contain an oxide belonging to each of the categories described below. The values of x, y and z in an oxide belonging to each category do not necessarily completely satisfy the values (including examples) described below. For example, oxygen may be partially deficient in an oxide, and a small amount of elements (e.g., IVa group element, Ib to Vb group elements, etc.) other than the elements A and D may be doped. The categories described below are not determined as a technical common sense in the technical field of the present invention, and they are set for convenience so as to facilitate the description of an oxide.

Category 1

In Category 1, x, y, and z are numerical values satisfying x=n+2, y=n+1, and z=3n+4. Herein, n is 0, 1, 2, or 3.

Examples of oxides belonging to Category 1 include those having an xyz index of (214) such as $Sr_2RuO_4$ and $(La, Sr)_2CoO_4$, and those having an xyz index of (327) such as $Sr_3Ru_2O_7$ and $(La, Sr)_3Mn_2O_7$. These oxides exhibit a so-called Ruddlesden-Popper structure.

When n=0, the oxides in Category 1 may include those in which the element D is placed at a position of the element A, and/or those in which the element A is placed at a position of the element D. Examples of the oxides in Category 1 may include those having a composition represented by Formula: $D_xA_yO_z$, and those having a composition represented by Formula: $D_xD_yO_z$. More specifically, examples of the oxides in Category 1 may include those having a spinel structure such as $Cr_2MgO_4$ (xyz index (214)), those (xyz index (214)) which contain no element A such as $Fe_2CoO_4$, $Fe_2FeO_4$ (i.e., $Fe_3O_4$), and the like.

Category 2

In Category 2, x, y, and z are numerical values satisfying x=n+1, y=n+1, and z=3n+5. Herein, n is 1, 2, 3, or 4. Examples of oxides belonging to Category 2 include those having partially intercalation of oxygen.

Category 3

In Category 3, x, y, and z are numerical values satisfying x=n, y=n, and z=3n. Herein, n is 1 or 2. When n=1, examples of oxides belonging to Category 3 include those having a perovskite crystal structure such as $SrMnO_3$ and $SrRuO_3$. When n=2, examples of oxides belonging to Category 3 include those having an xyz index of (226) such as $Sr_2FeMoO_6$ and $SmBaMn_2O_6$.

Category 4

In Category 4, x, y, and z are numerical values satisfying x=n+1, y=n, and z=4n+1. Herein, n is 1 or 2. When n=1, examples of the oxides belonging to Category 4 include those having an xyz index of (215) such as $Y_2MoO_5$. When n=2, examples of the oxides belonging to Category 4 include an oxide such as $SrBi_2Ta_2O_9$.

Other Categories

When x=0, y=1, and z=1, examples of the oxides include NiO, MnO, CoO, and the like. When x=0, y=n, and z=n+1 (n=1), examples of the oxides include $VO_2$, $MnO_2$, and the like. When x=0, y=n, and z=n+1(n=2), examples of the oxides include $V_2O_3$. When x=0, y=n, and z=2n+1 (n=2), examples of the oxides include $V_2O_5$.

The transition layer 3 may contain a plurality of kinds of the above-mentioned oxides. For example, the transition layer 3 may contain oxides with a superlattice that includes a combination of a structural unit cell and/or a small unit cell of oxides with different values of n in the same category. Specific categories, for example, include the above-mentioned category 1 (an oxide exhibiting a Ruddlesen-Popper structure), category 2 (an oxide having intercalation of oxygen), and the like. The oxides with such a superlattice have a crystal lattice structure in which oxygen octahedral layers of a single element D or plural elements D are separated by at least one block layer containing the element A and oxygen.

The transition layer 3 may contain a material that undergoes a methamagnetic transition by an electric field given from outside. For example, La (Fe, Si), FeRh, or the like may be used.

There is no particular limit to the shape of the transition layer 3. In the case where the transition layer 3 is in a layer shape as in the example shown in FIG. 1, the thickness of the transition layer 3 is, for example, in a range of 0.3 nm to 1000 nm, and preferably in a range of 1 nm to 100 nm. Furthermore, the transition layer 3 may have a plurality of laminated layers, and the thickness of each layer and the materials to be contained therein may be set arbitrarily in accordance with the characteristics required as the transition layer 3.

There is no particular limit to the materials used for the carrier supplier 4, as long as they include at least one material selected from metal and a semiconductor. Furthermore, it is preferable that carriers can be injected or induced to the transition layer 3 when a voltage is applied. More specifically, for example, the material may contain carriers in an amount of $10^{18}/cm^3$ or more, selected from electrons and holes, in the absence of a voltage. More specifically, in the case of a semiconductor, for example, AlN:Si or the like may be used. Furthermore, the carrier supplier 4 may be metal or the like. For example, $SrRuO_3$, Pt, or the like may be used. Furthermore, there is no particular limit to the type of metal. For example, pure metal, alloys, and metal compounds may be used.

There is no particular limit to the shape of the carrier supplier 4. The shape of the carrier supplier 4 may be set arbitrarily in accordance with the shape and the like required as a magnetic switching device. For example, the carrier supplier 4 may be in a layer shape as in the example shown in FIG. 1. The thickness of the carrier supplier 4 in this case is, for example, in a range of 1 nm to 100 μm.

There is no particular limit to the magnetic layer 2, as long as it is made of a magnetic substance capable of being magnetically coupled to the transition layer 3, and changing its magnetized state in accordance with the magnetic transition of the transition layer 3. Among them, a magnetic substance excellent in soft magnetic characteristics is preferable. More specifically, for example, the following magnetic substances may be used:

metal or an alloy containing at least one element selected from Fe, Co, and Ni (e.g., a FeCo alloy, a NiFe alloy, a CoNi alloy, a NiFeCo alloy, etc.);

alternatively, an alloy having a composition represented by Formula: $U^1U^2U^3$ (herein, $U^1$ is at least one element selected from Fe, Co, and Ni; $U^2$ is at least one element selected from Mg, Ca, Ti, Zr, Hf, V, Nb, Ta, Cr, Al, Si, Mg, Ge, and Ga; and $U^3$ is at least one element selected from N, B, O, F, and C.

For example, FeN, FeTiN, FeAlN, FeSiN, FeTaN, FeCoN, FeCoTiN, FeCo(Al, Si)N, FeCoTaN, etc.);

alternatively, an alloy having a composition represented by Formula: (Co, Fe)X (herein, x is at least one element selected from Ti, Zr, Hf, V, Nb, Ta, Cu, and B);

alternatively, an alloy having a composition represented by Formula: $ZZ^2$ (herein, $Z^1$ is at least one element selected from Fe, Co, and Ni; $Z^2$ is at least one element selected from Cu, Ag, Au, Pd, Pt, Rh, Ir, Ru, Os, Ru, Si, Ge, Al, Ga, Cr, Mo, W, V, Nb, Ta, Ti, Zr, Hf, La, Ce, Pr, Nd, Pm, Sm, Eu, Gd, Tb, Dy, Ho, Er, Tm, Yb, and Lu. For example, FeCr, FeSiAl, FeSi, FeAl, FeCoSi, FeCoAl, FeCoSiAl, FeCoTi, Fe(Ni)(Co)Pt, Fe(Ni)(Co)Pd, Fe(Ni)(Co)Rh, Fe(Ni)(Co)Ir, Fe(Ni)(Co)Ru, FePt, etc.);

alternatively, a half metal material such as $Fe_3O_4$, an alloy having a composition represented by Formula: EMnSb (herein, E is at least one element selected from Ni, Cu, and Pt. For example, LaSrMnO, LaCaSrMnO, $CrO_2$, etc.), and the like;

alternatively, an alloy having a composition represented by Formula: $G^1G^2G^3$ (herein, $G^1$ is at least one element selected from Sc, Y, lanthanoid (including La, Ce), Ti, Zr, Hf, Nb, Ta, and Zn; $G^2$ is at least one element selected from C, N, O, F, and S; and $G^3$ is at least one element selected from V, Cr, Mn, Fe, Co, and Ni);

alternatively, a magnetic semiconductor having a composition represented by Formula: $J^1J^2J^3$ herein, $J^1$ is at least one element selected from B, Al, Ga, and In; $J^2$ is at least one element selected from V, Cr, Mn, Fe, Co, and Ni; and $J^3$ is at least one element selected from As, C, N, O, P, and S. For example, GaMnN, AlMnN, GaAlMnN, AlBMnN, etc.);

alternatively, a perovskite oxide magnetic substance, a spinel oxide magnetic substance such as ferrite, a garnet oxide magnetic substance, and the like.

There is no particular limit to the shape of the magnetic layer 2. In the case where the magnetic layer 2 is in a layer shape as in the example shown in FIG. 1, the thickness of the magnetic layer 2 is, for example, in a range of 2 nm to 100 nm, and preferably in a range of 2 nm to 50 nm. Furthermore, the magnetic layer 2 may have a plurality of laminated magnetic layers (magnetic films), and the thickness of each magnetic layer (each magnetic film), a magnetic substance to be contained therein, and the like may be set arbitrarily in accordance with the characteristics required as the magnetic layer 2. Another layer may be placed, if required, between the magnetic layer 2 and the transition layer 3, as long as it does not inhibit the magnetic coupling therebetween.

In the case where the insulating layer (Ilayer) 5 is placed between the transition layer 3 and the carrier supplier 4, there is no particular limit to the material to be used for the insulating layer 5, as long as it contains at least one material selected from an insulator and a semiconductor. For example, a compound may be used, which contains at least one element selected from IIa group to VIa group elements including Mg, Ti, Zr, Hf, V, Nb, Ta, and Cr, and lanthanoid (including La, Ce), IIb group to IVb group including Zn, B, Al, Ga, and Si, and at least one element selected from F, O, C, N, and B. Among them, it is preferable that $SiO_2$, $Al_2O_3$, MgO, or the like is used as an insulator, and ZnO, $SrTiO_3$, $LaAlO_3$, AlN, SiC, or the like is used as a semiconductor.

The thickness of the insulating layer 5 is, for example, in a range of 0.1 nm to 100 nm, and preferably in a range of 0.1 nm to 10 nm in terms of tunnel insulating characteristics.

Figure 5:
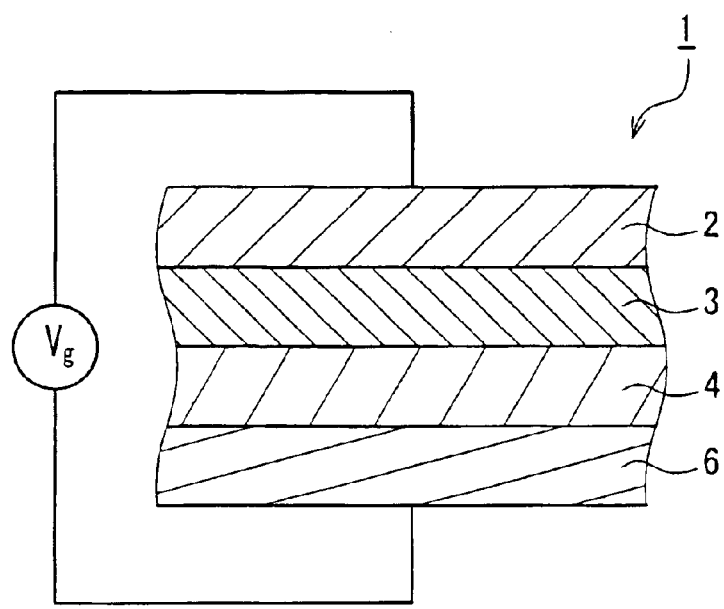
FIG. 5 is a schematic view-showing still another exemplary magnetic switching device of the present invention.

There is no particular limit to a method for applying a voltage between the transition layer 3 and the carrier supplier 4 in the magnetic switching device 1 of the present invention. For example, as in the example shown in FIG. 1, a wire for applying a voltage may be connected to the magnetic layer 2 and the carrier supplier 4 (or the transition layer 3 and the carrier supplier 4). Furthermore, as shown in FIG. 5, the magnetic switching device 1 further may include an electrode 6 for applying a voltage. In the magnetic switching device 1 shown in FIG. 5, the electrode 6 for applying a voltage is placed so that the carrier supplier 4 is interposed between the electrode 6 and the transition layer 3. In the magnetic switching device 1 with such a configuration, a voltage can be applied more stably. In the example shown in FIG. 5, the electrode 6 is placed only on the carrier supplier side. However, the electrode 6 may be placed on the magnetic layer 2 side (for example, the electrode 6 may be placed so as to be in contact with the magnetic layer 2). In the case where the magnetic layer 2 and the carrier supplier 4 are made of metal, the magnetic layer 2 and the carrier supplier 4 also can function as electrodes.

There is no particular limit to the material used for the electrode 6, as long as it is a conductive material. In particular, a material having a line resistance of 100 $\mu m\Omega cm$ or less, for example, is preferable. More specifically, for example, Au, Cu, Al, Pt, or the like may be used.

Figure 6:
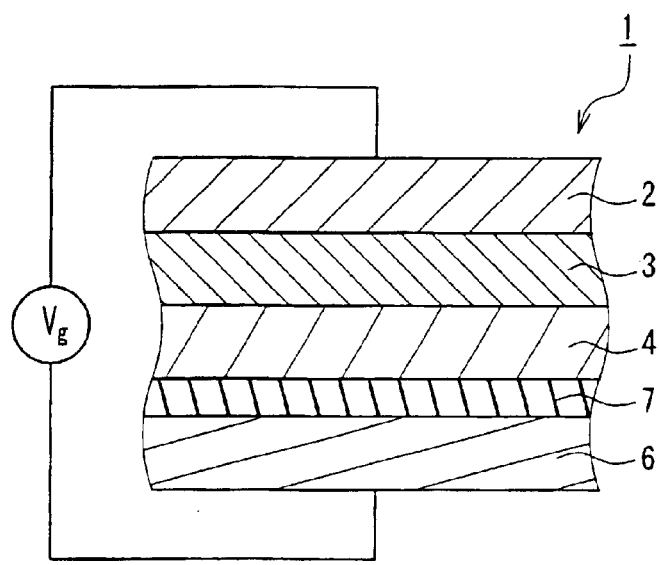
FIG. 6 is a schematic view showing still another exemplary magnetic switching device of the present invention.
Figure 7:
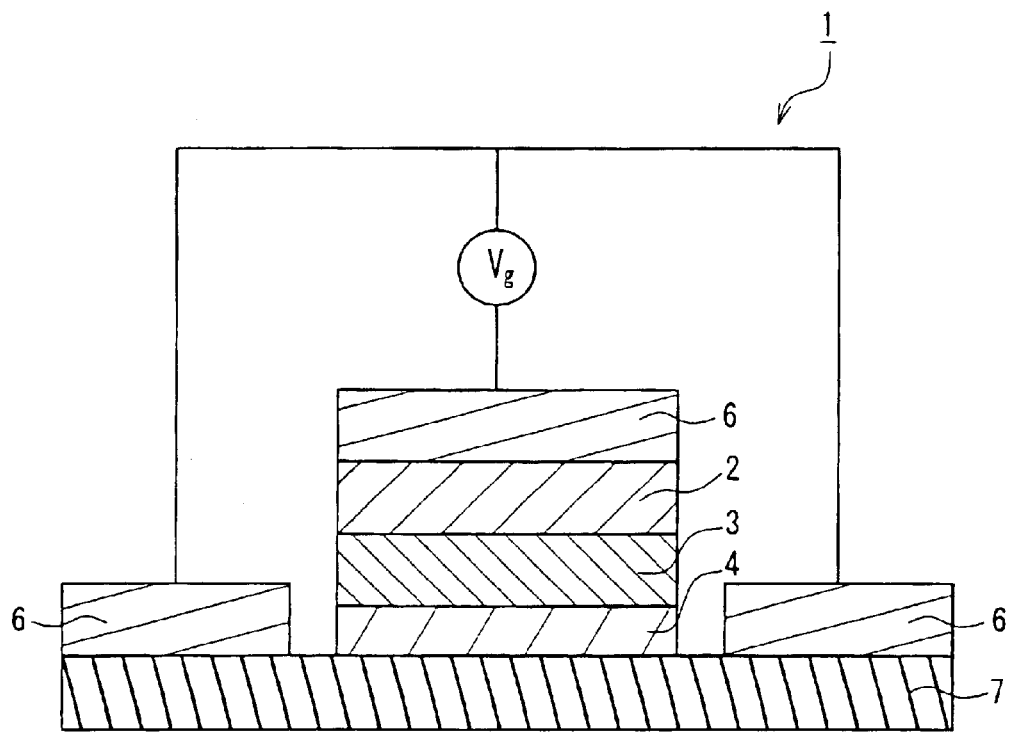
FIG. 7 is a schematic view showing still another exemplary magnetic switching device of the present invention.

FIG. 6 is a schematic view showing still another example of the magnetic switching device 1 of the present invention. In the magnetic switching device 1 shown in FIG. 6, an insulating layer 7 is placed between the electrode 6 and the carrier supplier 4. In the magnetic switching device 1 with such a configuration, an electric power for subjecting the transition layer 3 to a magnetic transition (i.e., an electric power for injecting or inducing carriers to the transition layer 3, for example) can be reduced, so that the magnetic switching device 1 with a higher energy conversion efficiency can be obtained. Furthermore, in the case where the insulating layer 7 is placed between the electrode 6 and the carrier supplier 4, the magnetic switching device 1 also may be obtained in which each layer is placed in a plane of the insulating layer 7, as shown in FIG. 7.

The material used for the insulating layer 7 may be the same as that used for the above-mentioned insulating layer 5. The thickness of the insulating layer 7 is, for example, in a range of 0.1 am to 100 $\mu$m. In the case where the insulating layer 7 is placed between the electrode 6 and the carrier supplier 4, the thickness of the insulating layer 7 preferably is in a range of 0.1 nm to 100 nm.

Figure 8A:
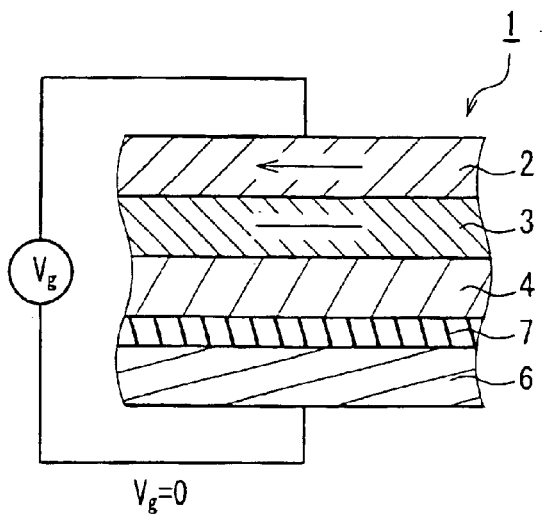
FIGS. 8A, 8B, and 8C are schematic views showing exemplary changes in magnetized states of a transition layer and a magnetic layer in the magnetic switching device of the present invention.
Figure 8B:
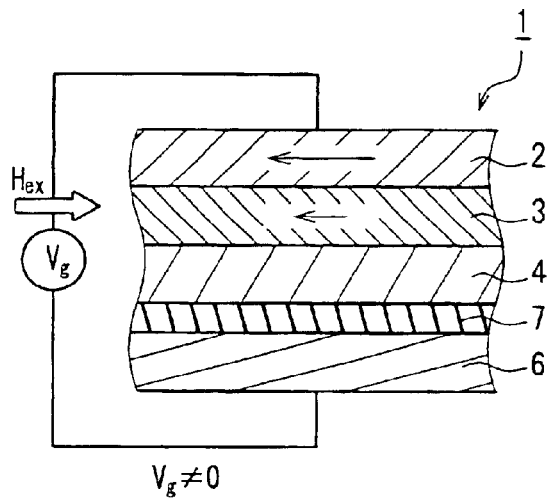
Figure 8C:
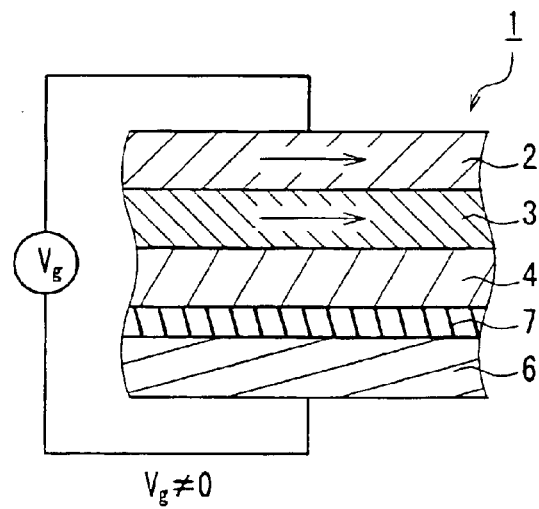

The magnetic switching device of the present invention further may include a magnetic field generating portion for applying a magnetic field to at least one layer selected from the transition layer 3 and the magnetic layer 2. When the transition layer 3 exhibits ferromagnetism due to a magnetic transition, the magnetized state (for example, a magnetization direction) of the transition layer 3 can be stabilized in a stage where the saturation magnetization in a transition process is weak. Therefore, the magnetic switching device 1 with a higher energy conversion efficiency can be obtained. FIGS. 8A to 8C show an exemplary magnetic transition of the transition layer 3 in the above-mentioned magnetic switching device.

The magnetic switching device 1 shown in FIGS. 8A to 8C is similar to the magnetic switching device 1 shown in FIG. 6. As shown in FIG. 8A, when the applied voltage $V_g=0$, the transition layer 3 is in a paramagnetic state. When the applied voltage $V_g$ ($V_g \neq 0$) is applied between the carrier supplier 4 and the transition layer 3, for example, carriers are injected from the carrier supplier 4 to the transition layer 3, whereby the transition layer 3 starts a magnetic transition (FIG. 8B). For a while after the transition layer 3 starts a magnetic transition, the saturation magnetization is still weak, and the transition layer 3 has not exhibited a clear magnetized state (for example, a magnetization direction). At this time, if a magnetic field $H_{ex}$ is applied for example, a magnetic field is applied to the transition layer 3 in the same direction as the magnetization direction of the magnetic layer 3 obtained after the transition) so as to realize a magnetized state after the transition of the transition layer 3, the magnetic transition of the transition layer 3 and a change in the magnetized state of the magnetic layer 2 can be completed in an early stage in a transition process (FIG. 8C). That is, energy required for changing the magnetized state of the magnetic layer 2 can be reduced.

The direction of the magnetic field $He_x$ applied by the magnetic field generating portion may be, for example, a direction for complementing the magnetized state of the transition layer 3 obtained when the transition layer 3 is in a ferromagnetic state (for example, the same direction as the magnetization direction obtained in the transition layer 3). Furthermore, the intensity of the magnetic field $H_{ex}$ is not particularly limited, and may be set arbitrarily in accordance with the characteristics required for the magnetic switching device 1. For example, the intensity is in a range of $4 \times 10^2$ A/m to $4 \times 10^5$ A/m. The magnetic field $H_{ex}$ preferably is applied to the transition layer 3.

The magnetic field generating portion is not particularly limited in its configuration, arrangement, and the like, as long as it can apply a magnetic field to at least one layer selected from the transition layer 3 and the magnetic layer 2. For example, the magnetic field generating portion may include at least one selected from a ferromagnetic substance, a coil, and a lead. In the case where the magnetic field generating portion includes at least one selected from a coil and a lead, the magnetic field generating portion can apply a magnetic field only during a period of time required in a magnetic transition of the transition layer 3. In the case where the magnetic field generating portion includes a ferromagnetic substance, the electric power for applying a magnetic field can be reduced.

Figure 9:
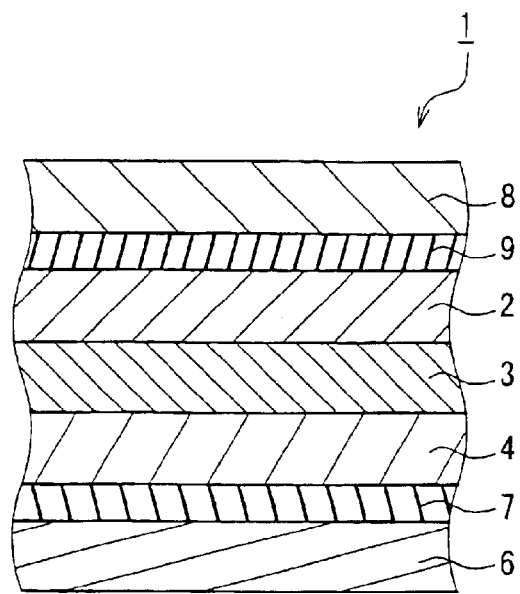
FIG. 9 is a schematic view showing still another exemplary magnetic switching device of the present invention.

FIG. 9 shows still another example of the magnetic switching device of the present invention. In the magnetic switching device 1 shown in FIG. 9, a magnetic field generating portion 8 made of a lead is placed on the magnetic layer 2 of the magnetic switching device 1 shown in FIG. 6 with an insulating portion 9 interposed therebetween. In other words, at least one layer selected from the transition layer 3 and the magnetic layer 2 is interposed between the magnetic field generating portion 8 and the carrier supplier 4. The position where the magnetic field generating portion 8 is placed is not limited to the example shown in FIG. 9. There is no particular limit to the position, as long as a magnetic field can be applied to at least one layer selected from the transition layer 3 and the magnetic layer 2. The insulating portion 9 is not particularly limited, as long as it is made of an insulating material. For example, an inorganic insulating substance such as $SiO_2$, resin, or the like may be used.

Figure 10:
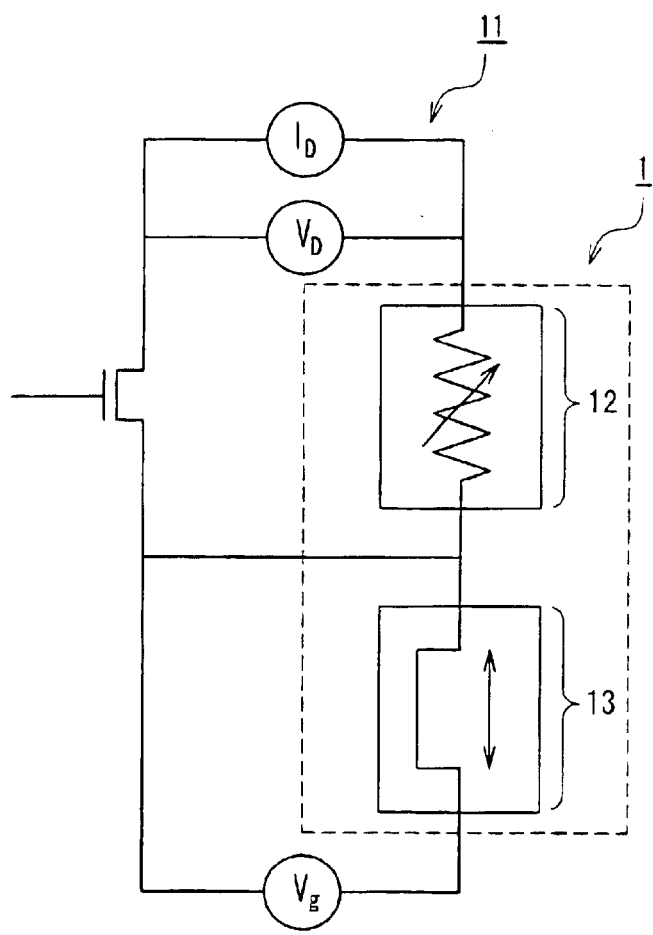
FIG. 10 is a schematic view showing an exemplary circuit using the magnetic switching device of the present invention.

The magnetic switching device of the present invention further may include a detecting portion for detecting a change in the magnetized state of the magnetic layer 2. By further placing the detecting portion, a magnetic switching device can be obtained that is capable of performing conversion from magnetic energy to electric energy, as well as performing conversion from electric energy to magnetic energy. More specifically, for example, a magnetic switching device can be obtained in which an electric signal is saved as magnetic information, and the magnetic information can be converted to an electric signal, if required, to be read. In the case of using such a device, for example, a circuit 11 shown in FIG. 10 may be formed. The circuit 11 shown in FIG. 10 is wired in the following manner: the magnetic switching device 1 is divided into a detecting portion 12 and a transition portion 13 including the transition layer 3 and the carrier supplier 4; the voltage $V_g$ is applied to the transition layer 13; and the resistance of the detecting portion 12 is measured by measuring a voltage $V_D$ and a current $I_D$.

The detecting portion is not particularly limited in its configuration, arrangement, and the like, as long as it can detect a change in the magnetized state of the magnetic layer 2. For example, the detecting portion only needs to be able to detect a change in the magnetized state of the magnetic layer 2 as an electric resistance. As such a detecting portion, for example, there is a detecting portion including a magnetoresistive device (MR device).

Figure 11:
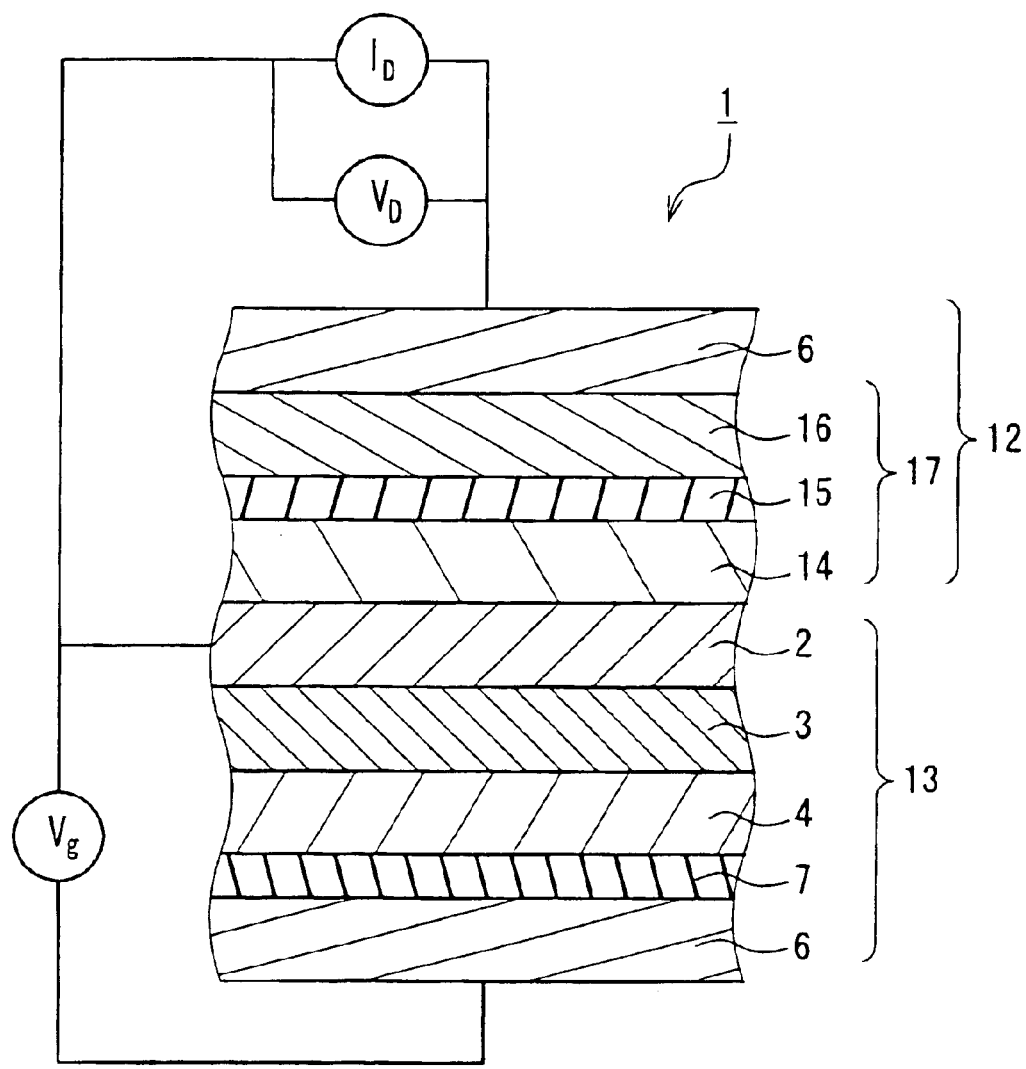
FIG. 11 is a schematic view using still another exemplary magnetic switching device of the present invention.

FIG. 11 shows an example of the magnetic switching device 1 including such a detecting portion. In the magnetic switching device 1 shown in FIG. 11, a free magnetic layer 14, a non-magnetic layer 15, a fixed magnetic layer 16, and an electrode 6 are laminated successively on the magnetic layer 2 of the magnetic switching device shown in FIG. 6. The detecting portion 12 includes an MR device 17 including the free magnetic layer 14, the non-magnetic layer 15, and the fixed magnetic layer 16. The free magnetic layer 14 is magnetically coupled to the magnetic layer 2 included in the transition portion 13, and the magnetized state of the free magnetic layer 2 can be changed along with the change in the magnetized state of the magnetic layer 2. The magnetoresistive device generally has a configuration in which a pair of magnetic layers are laminated so as to interpose a non-magnetic layer therebetween, and its resistance is varied depending upon the relative angle between the magnetization direction of the free magnetic layer that is easy to change relatively, and the magnetization direction of the fixed magnetic layer that is difficult to change relatively. Therefore, in the magnetic switching device 1 shown in FIG. 11, the resistance of the MR device 17 is varied depending upon the magnetized state of the magnetic layer 2. Therefore, the magnetized state of the magnetic layer 2 can be detected by the detecting portion 12.

A magnetic substance may be used for the free magnetic layer 14 and the fixed magnetic layer 16. The magnetization direction of the free magnetic layer 14 needs to change easily relative to the fixed magnetic layer 16. Therefore, it is preferable to use magnetic substances having different characteristics for the respective layers.

The free magnetic layer 14 may be made of, for example, the same material as that used for the magnetic layer 2. In particular, a magnetic material excellent in soft magnetic characteristics preferably is used. The thickness of the free magnetic layer 14 is, for example, in a range of 2 nm to 50 nm.

The fixed magnetic layer 16 may be made of, for example, a magnetic substance having a coercivity higher than that of the free magnetic layer 14. More specifically, for example, a high coercive magnetic substance, a laminated ferrimagnet, or an anti-ferromagnetic substance, and/or a laminate of a laminated ferrimagnet and a ferromagnetic substance can be used. In the case of using the above-mentioned laminate, it is necessary that the laminated ferrimagnet or the ferromagnetic substance faces the non-magnetic layer 15.

As the high coercive magnetic substance, for example, materials having a coercivity of 100 Oe (100 oersted) or more, such as CoPt, FePt, CoCrPt, CoTaPt, FeTaPt, FeCrPt, and the like, may be used. As the anti-ferromagnetic substance, for example, a Mn-based anti-ferromagnetic substance such as PtMn, PtPdMn, FeMn, IrMn, NiMn, and the like may be used The laminated ferrimagnet may be a laminate of a magnetic film and a non-magnetic film, in which a pair of magnetic films are laminated so as to interpose a non-magnetic film therebetween. As the magnetic film used for the laminated ferrimagnet, for example, Co, or a Co-containing alloy such as FeCo, CoFeNi, CoNi, CoZrTa, CoZrTa, CoZrNb, and the like may be used. As the non-magnetic film used for the laminated ferrimagnet, for example, Cu, Ag, Au, Ru, Rh, Ir, Re, Os, an alloy thereof, an oxide thereof, or the like may be used. There is no particular limit to the ferromagnetic substance. For example, the same material as that of the magnetic layer 2 may be used. In addition, a magnetic material generally used for the MR device may be used. The thickness of the fixed magnetic layer 16 is not particularly limited, and for example, is in a range of 2 nm to 100 nm.

In order to fix the magnetization direction of the fixed magnetic layer. 16, for example, it only needs to form a fixed magnetic layer while applying a magnetic field in one direction, and to perform heat treatment while applying a magnetic field after forming the fixed magnetic layer. In the case where the fixed magnetic layer 16 is formed of a laminate of a ferromagnetic substance and an anti-ferromagnetic substance, for example, by using an anti-ferromagnetic substance having anisotropy in one direction, the magnetization direction of a ferromagnetic substance can be fixed by magnetic exchange coupling.

The non-magnetic layer 15 may be made of an insulating material, or may be made of a conductive material. That is, the MR device 17 may be a so-called tunneling magnetoresistive device (TMR device) or giant magnetoresistive device (GMR device). In terms of an energy conversion efficiency of the detecting portion, it is preferable that the non-magnetic layer 15 is made of an insulating material, i.e., the non-magnetic layer 15 is a tunnel insulating layer. As the conductive material used for the non-magnetic layer 15, for example, Cu, Ag, Au, Ru, or the like may be used. In this case, the thickness of the non-magnetic layer 15 is, for example, in a range of 0.1 nm to 10 nm. As the insulating material used for the non-magnetic layer 15, for example, an oxide, a nitride, an oxynitride, and the like of Al, Mg, Zu, etc. may be used In this case, the thickness of the non-magnetic layer 15 is, for example, in a range of 0.1 nm to 10 nm.

The free magnetic layer 14 may include the above-mentioned laminated ferrimagnet. Particularly, in the case where a device size is set to be a submicron size, the free magnetic layer 14 preferably contains a laminated ferrimagnet. Thus, an anti-magnetic field component generated in the case of miniaturizing a device can be reduced, and the soft magnetic characteristics of the free magnetic layer 14 can be suppressed from being degraded even in the case where the device size is decreased.

Figure 12:
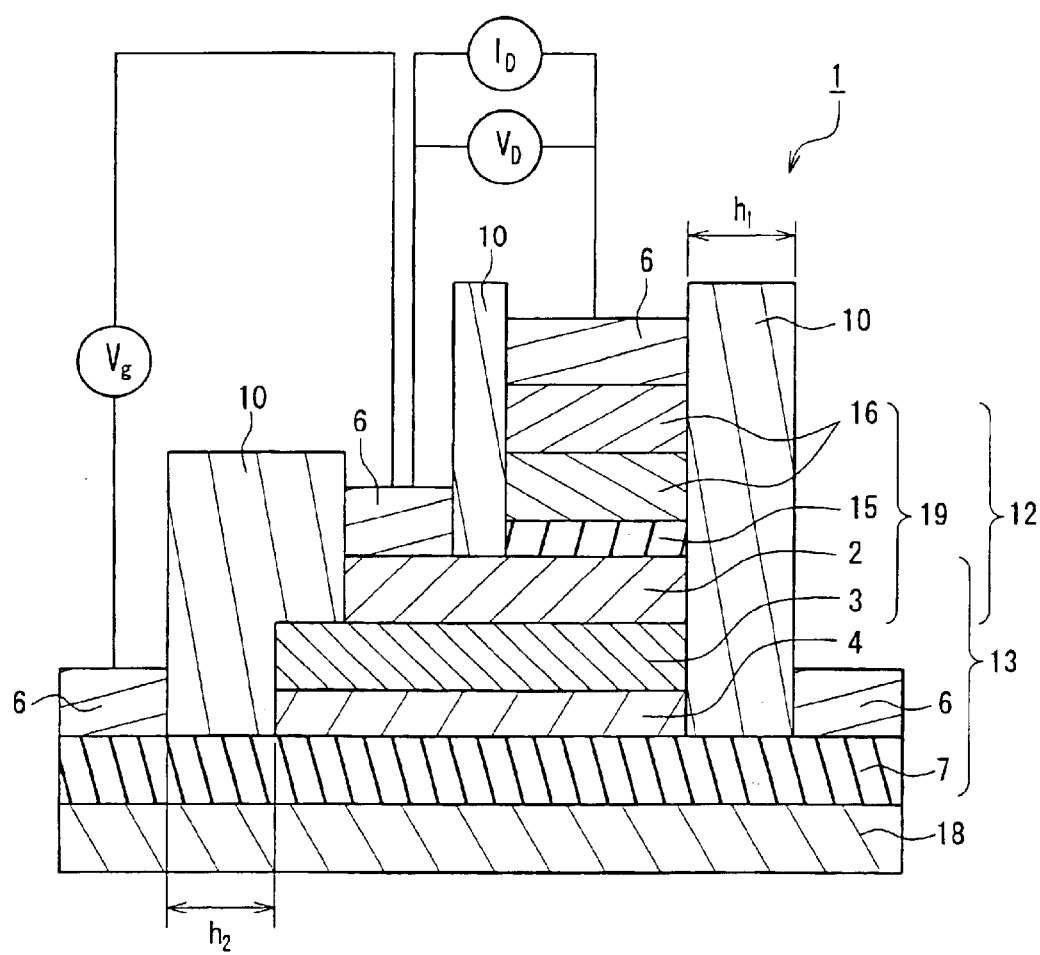
FIG. 12 is a schematic view using still another exemplary magnetic switching device of the present invention.

FIG. 12 shows still another example of the magnetic switching device of the present invention. The magnetic switching device 1 shown in FIG. 12 includes the detecting portion 12 for detecting the magnetized state of the magnetic layer 2. The detecting portion 12 includes the fixed magnetic layer 16 and the non-magnetic layer 15. The non-magnetic layer 15 and the fixed magnetic layer 16 are placed so that the non-magnetic layer 15 is interposed between the magnetic layer 2 and the fixed magnetic layer 16. In the device shown in FIG. 12, the magnetic layer 2, the non-magnetic layer 15, and the fixed magnetic layer 16 form a magnetoresistive device portion (MR device portion) 19, and a change in the magnetized state of the magnetic layer 2 can be detected based on a change in the resistance of the MR device portion 19. That is, not only by placing the MR device 17 on the magnetic layer 2 as in the example shown in FIG. 11, but also by forming the MR device portion 19 including the magnetic layer 2 as a free magnetic layer, the magnetized state of the magnetic layer 2 can be detected.

Furthermore, the entire magnetic switching device 1 shown in FIG. 12 is placed on a substrate 18. As the substrate 18, for example, a substrate generally used for a semiconductor device may be used. For example, a glass substrate, a $SiO_2$ substrate, a sapphire substrate, a MgO substrate, a $SiTiO_3$ substrate, or the like may be used. In the magnetic switching device 1 shown in FIG. 12, an interlayer insulating portion 10 is placed so as to prevent a leakage between the electrode 6 and each layer, and by changing the width ($h_1$, $h_2$ shown in FIG. 12) of the interlayer insulating portion 10, a distance between the carrier supplier 4 and the electrode 6 can be controlled. That is the characteristics (e.g., the threshold value of the voltage $V_g$ at which the transition layer 3 undergoes a magnetic transition, etc.) of the device also can be controlled by the width of the interlayer insulating portion 10. The widths $h_1$, $h_2$ of the interlayer insulating portion 10 may be varied, for example, depending upon the voltage $V_g$ to be applied. For example, when the voltage $V_g$ is 50 V or more, the widths $h_1$, $h_2$ are in a range of 1 nm to 1000 nm. In the case where the voltage $V_g$ is in a range of about 1 V to 50 V, the widths $h_1$, $h_2$ preferably are in a range of about 1 nm to 500 nm in terms of an energy conversion efficiency.

The interlayer insulating portion 10 is not particularly limited, as long as it is made of an insulating material. For example, an oxide such as $Al_2O_3$ and $SiO_2$, resin such as polyimide, $CaF_2$, or the like may be used. In the case where the width of the interlayer insulating portion 10 is 100 nm or more, an oxide such as $Al_2O_3$ preferably is used. In the case where the width of the interlayer insulating portion 10 is 500 nm or more, resin such as polyimide preferably is used in terms of convenience and ease of a production process.

In order to form each layer constituting the magnetic switching device, for example, various kinds of sputtering methods such as pulse laser deposition (PLD), ion beam deposition (IBD), cluster ion beam deposition, RF, DC, electron cyclotron resonance (ECR), helicon, inductively coupled plasma (ICP), and an opposed target, molecular beam epitaxy (MBE), ion plating, or the like may be used. In addition to these PVD methods, a CVD method, a plating method, a sol-gel method, or the like may be used. In the case where it is necessary to perform micromachining, procedures generally used for a semiconductor process, a-magnetic head production process, and the like may be combined. More specifically, a physical or chemical etching method such as ion milling, reactive ion etching (RIE), and focused ion beam (FIB) method, and a photolithography technique using steppering and an electron beam (EB) method for forming a fine pattern may be combined.

Next, a magnetic memory of the present invention will be described.

Figure 13:
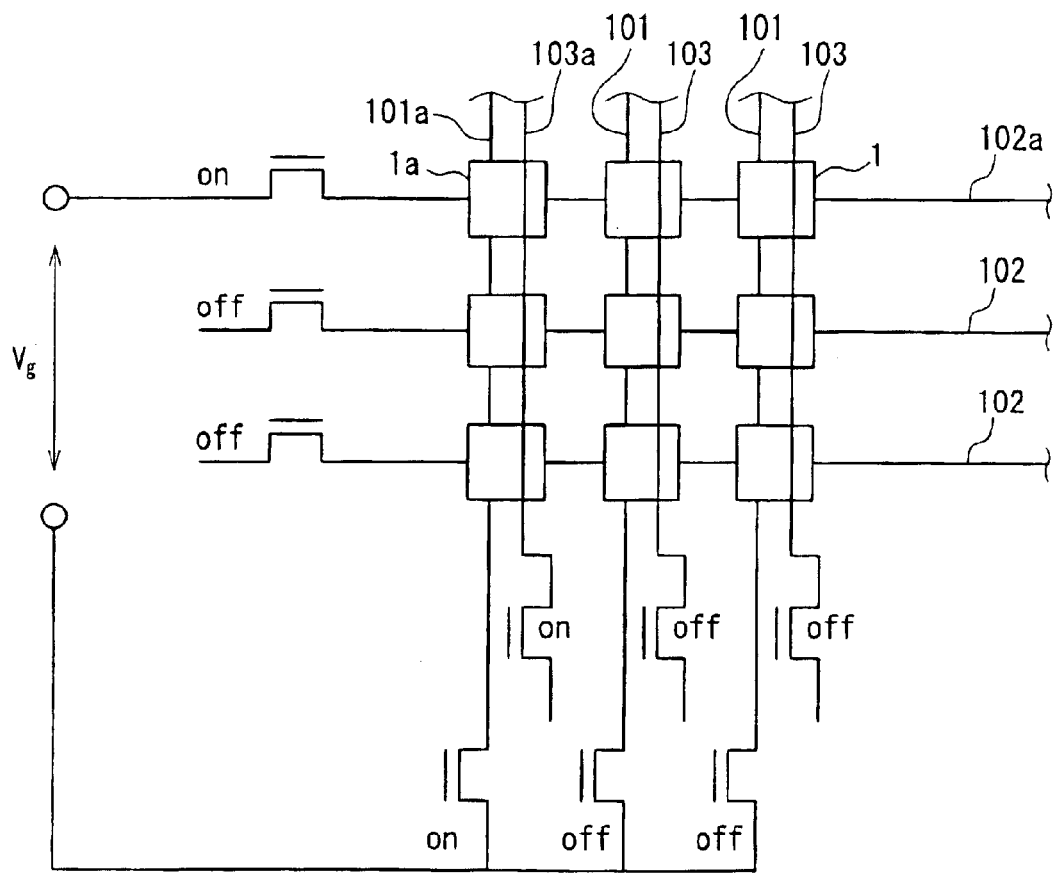
FIG. 13 is a schematic view showing an exemplary magnetic memory of the present invention.

The magnetic memory of the present invention includes a plurality of magnetic switching devices including the above-mentioned detecting portion, information recording leads for recording information in the magnetic switching devices, and information reading leads for reading the information recorded in the devices. FIG. 13 shows an example of such a magnetic memory.

In the magnetic memory shown in FIG. 13, the magnetic switching devices 1 are placed in a matrix at intersections between first recording lines (word lines) 101 and second recording lines (it lines) 102, made of Cu, Al, or the like. Simultaneously, the magnetic switching devices 1 are placed in a matrix at intersections between the second recording lines 102 and reading lines (sense lines) 103 made of Ca, Al, or the like. The word lines 101 and the bit lines 102 correspond to the information recording leads. The bit lines 102 and the sense lines 103 correspond to the information reading leads. The magnetic switching device 1 includes an MR device portion as a detecting portion.

Figure 14:
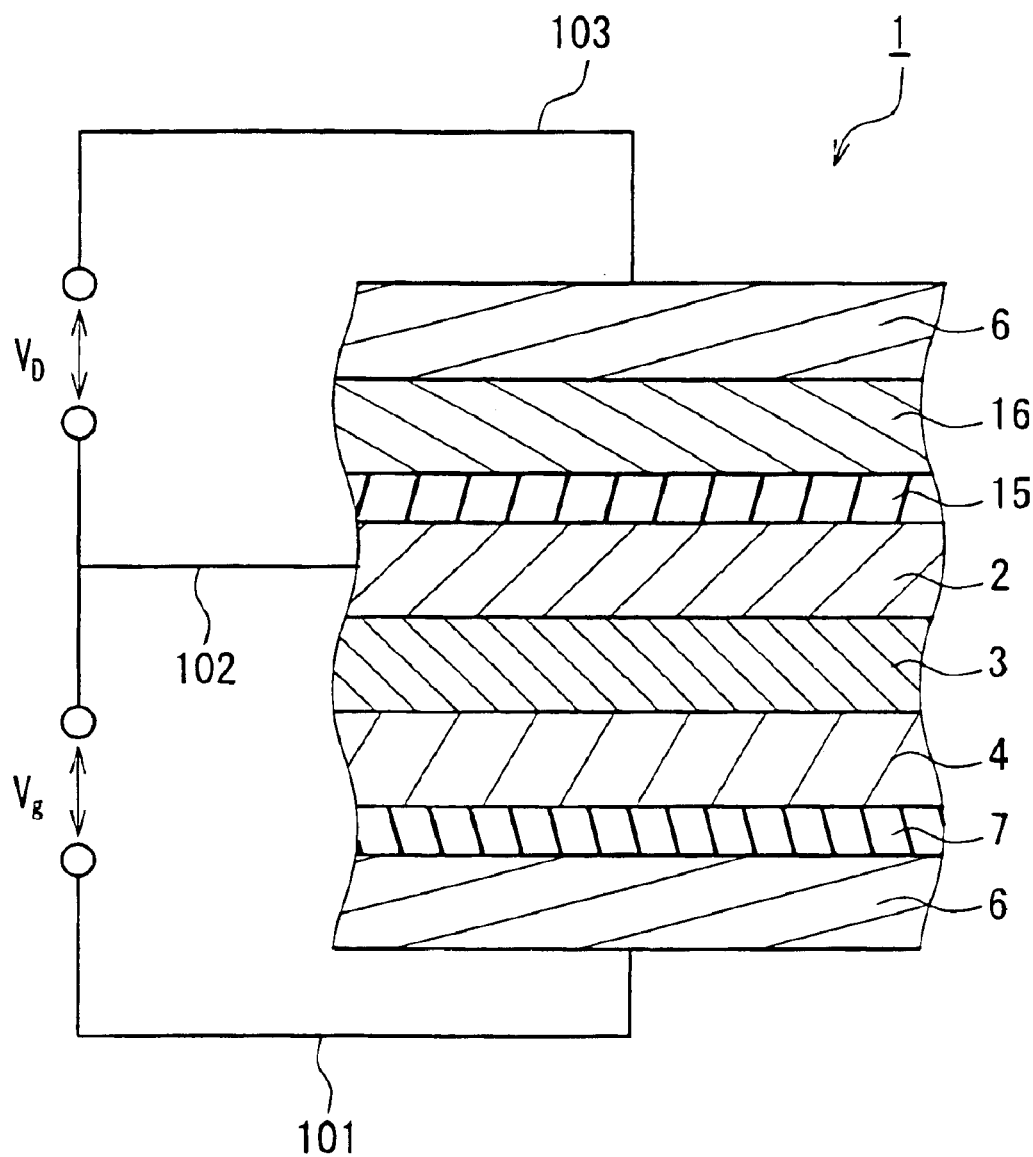
FIG. 14 is a schematic view showing an exemplary relationship between a magnetic switching device used in the magnetic memory of the present invention, and an information recording lead and an information reading lead.

As shown in FIG. 14, the word line 101 is connected to the carrier supplier 4 included in the magnetic switching device 1 via the electrode 6 and the insulating layer 7. The sense line 103 is connected to the fixed magnetic layer 16 in the detecting portion included in the magnetic switching device 1 via the electrode 6. The bit line 102 is connected to the magnetic layer 2.

As shown in FIG. 13, by applying the voltage $V_g$ between the word line 101 and the bit line 102, information is recorded on the magnetic layer 2 of the magnetic switching device 1. Information is recorded in the magnetic switching device 1 (in FIG. 13, a magnetic switching device 1a placed at a position where a word line 101a and a bit line 102a intersect with each other) placed at a position where the word line 101 and the bit line 102 in an "on" state intersect with each other. At this time, the sense line 103 can be used as a magnetic field generating portion (assist line) for applying the magnetic field $H_{ex}$ to the magnetic switching device. In the case where the sense line 103 is used as the magnetic field generating portion, the sense line (assist line) 103a only needs to be turned on, as shown in FIG. 13. The assist line may be placed separately from the sense line.

In reading information recorded in the magnetic switching device 1, a sense current only needs to be allowed to flow through the detecting portion of the magnetic switching device 1a via the bit line 102a and the sense line 103a intersecting with the magnetic switching device 1a in which information has been recorded. The resistance of the MR device portion included in the magnetic switching device 1 is varied depending upon information. Therefore, information can be read by detecting a voltage $V_D$ generated between the bit line 102a and the sense line 103a.

In order to switch between an "on" state and an "off" state in the word line 101, the bit line 102, and the sense line 103, for example, a switching device such as a FET, a varistor, a non-linear device such as a tunnel device, a rectifier, or the like may be used.

EXAMPLES

Hereinafter, the present invention will be described in more detail by way of examples. The present invention is not limited to the following examples.

Example 1

A magnetic switching device (Sample 1) having the following film configuration was produced, using MBE. Sample 1 had the shape as shown in FIG. 12.

Sample 1

Sapphire substrate/AlN (500)/AlN:Si (100)AlMnN:Si (10)/CoFe (10)/AlO (1)/CoFe (10)/PtMn (25)/Ta (3)/Cu (100)/Ta (25)

Herein, the numerical values in the parentheses represent a film thickness. The unit is "nm". Hereinafter, the film thickness will be shown similarly.

An AlN layer on the sapphire substrate is an insulating layer 7. An AlN:Si layer is a carrier supplier 4. An AlMnN:Si layer is a transition layer 3. A CoFe layer is a magnetic layer 2. AlO is a non-magnetic layer 15. A CoFe/PtMn layer is a fixed magnetic layer 16 with an anti-ferromagnetic substance (PtMn) laminated on CoFe. The PtMn layer made of an anti-ferromagnetic substance sets the adjacent CoFe layer to be a fixed magnetic layer by magnetic coupling. A Ta/Cu/Ta laminate is an electrode 6 on the fixed magnetic layer 16. This also applies to the other electrodes 6. An alignment constant of the sapphire substrate is (0001).

A method for producing Sample 1 will be described.

First, an AlN layer was produced on a sapphire substrate. At this time, the substrate temperature was set to be in a range of about 500° C. to about 600° C. (mainly, 550° C.). For producing the AN layer, an Al layer previously was produced on a substrate, and the Al layer was nitrided by plasma nitriding, whereby an AlN layer was obtained. Next, an AlN:Si/AlMnN:Si multilayered film was laminated on the AlN layer under the condition that the substrate temperature was kept in a range of about 200° C. to about 300° C. (mainly, 250° C.). Then, a CoFe layer was laminated on the AlMnN:Si layer under the condition that the substrate temperature was kept in a range of room temperature to 200° C. (mainly, room temperature).

The composition ratio of the AlMnN:Si layer i.e., the transition layer) i to be $Al_{0.8}Mn_{0.2}N$:Si The Mn amount of AlMnN was set to be about 0.001 atomic % to about 0.25 atomic %. It was confirmed separately that in the case where Mn is contained in the above range, the reproducibility of a paramagnetism—ferromagnetism transition is most satisfactory. The AlMnN:Si layer exhibits paramagnetism in a state where electrons are not injected or induced as carriers, and exhibits ferromagnetism in a state where electrons are injected or induced.

The Si doped amount in the AlN:Si layer (i.e., the carrier supplier) was set to be 0.1 atomic %. At this time, the number of carriers included in the AlN:Si layer was confirmed to be $10^{18}/cm^3$ or more by hole measurement. The Si doped amount in the transition layer also was set to be 0.1 atomic %. It was confirmed separately that when the Si doped amount is in a range of about 0.001 atomic % to about 0.3 atomic %, the characteristics of the carrier supplier are most satisfactory.

Next, an AlO layer, a CoFe layer, and a PtMn layer were laminated on the AlN:Si layer. The value in parentheses of the AlO layer is a total value of designed film thickness of Al before oxidation. Actually, Al was formed as a film to a thickness of 0.3 nm to 0.7 nm and thereafter, oxidation in an atmosphere containing oxygen was performed. This process was repeated.

Next, the entire layered structure was micromachined to the shape as shown in FIG. 12 by photolithography. The device size of an area to be supplied with the voltage $V_g$ (i.e., the size of the carrier supplier 4, the transition layer 3, and the magnetic layer 2) was set to be about 1.5 μm×3 μm, seen from a direction vertical to a principal plane of the device. In the subsequent examples, the size of the area to be supplied with the voltage $V_g$ similarly was set to be a device size. Then, a Ta/Cu/Ta layer was laminated to obtain an electrode, and finally, an interlayer insulating portion 10 made of $Al_2O_3$ was placed to produce Sample 1. The width of the interlayer insulating portion 10 was set to be 300 nm.

Each layer was formed under conditions in which each layer was transported in a vacuum even when a layer to be formed was switched, whereby the exposure of the layers to the atmosphere was minimized. Furthermore, the PtMn layer was heat-treated at a temperature of 280° C. in a magnetic field of 5 kOe when a multilayered film was laminated, whereby anisotropy in one direction was given. This also applies to the subsequent examples. The heat treatment also may be performed in a magnetic field after the device was micromachined.

The magnetic switching device thus produced was measured for a temperature range in which the magnetoresistive effect of the detecting portion was detected. The magnetoresistive effect was confirmed by applying a magnetic field to the device in a range of ±5 kOe, and measuring whether or not the resistance of the detecting portion was changed.

As a result, it was confirmed that the magnetoresistive effect can be detected in a temperature range of 4 kelvin (K) to 370 K.

Next, the magnetic switching device was kept at 23 K, and a voltage was applied between the carrier supplier and the transition layer. First, in the case where a voltage (0 V to 200 V) was applied so as to increase the potential of the carrier supplier with respect to the transition layer, no change was found in the resistance of the detecting portion. Next, when a voltage (0 V to 200 V) was applied so as to decrease the potential of the carrier supplier with respect to the transition layer, electrons moved from the carrier supplier to the transition layer, and a magnetoresistive ratio (MR ratio) of about 30% was obtained as an MR ratio, which can be considered an index of a change in the resistance of the detecting portion. The change in the resistance of the detecting portion started while a voltage of about 20 V was applied, and a largest MR ratio was obtained when a voltage of about 120 V was applied. In the region where a voltage of 120 V or more was applied, the obtained MR ratio hardly changed, and exhibited a tendency of being saturated.

The MR ratio can be obtained as follows. It is assumed that a maximum resistance of the detecting portion obtained when a voltage is applied is $R_{MAX}$, and a minimum resistance thereof is $R_{MIN}$. In this case, the MR ratio is a numerical value given by the following Formula (1):

$$MR\ ratio\ (\%) = (R_{MAX} - R_{MIN})/R_{MIN} \times 100\ (\%) \qquad (1)$$

In the case where the detecting portion constitutes the above-mentioned TMR device or GMR device, when the magnetization direction of the free magnetic layer is identical (parallel) to that of the fixed magnetic layer, the resistance becomes minimum $R_{MIN}$) As both the magnetization directions are shifted from the identical direction, the resistance is increased.

In Sample 1, the insulating layer, the carrier supplier, and the transition layer were all made of a nitride. In the case where materials of the same system were thus used for the carrier supplier and the transition layer (e.g., all the layers were made of a nitride, an oxide, etc.), the interface of the respective layers was unlikely to be disturbed. For such a reason, a magnetic switching device thus obtained tended to have satisfactory characteristics. This tendency also applies to the subsequent examples.

In addition to the AlMnN:Si layer used as the transition layer in Sample 1, even in the case where $Ga_{1-\alpha}Mn_\alpha N$:Si layer, $(Ga_{0.5}Al_{0.5})_{1-\alpha}Mn_\alpha N$:Si layer, $(Al_{0.9}B_{0.1})_{1-\alpha}Mn_\alpha N$:Si layer, or the like was used, the same device operation was confirmed. Herein, a is a numerical value satisfying $0.01 \leq \alpha \leq 0.2$. The production conditions of the device were set to be the same as those in Sample 1.

Furthermore, in addition to the AlN:Si layer used as the carrier supplier in Sample 1, even in the case where an AlN:Ge layer, a GaN:Si layer, or the like was used, the same device operation was confirmed.

In Example 1, the sample was produced by the MBE. Instead of this, the same samples were produced even in the case of using pulse laser deposition (PLD), magnetron sputtering, or electron beam (EB) deposition. The results of these samples also were the same as those of Sample 1.

Example 2

Figure 15:
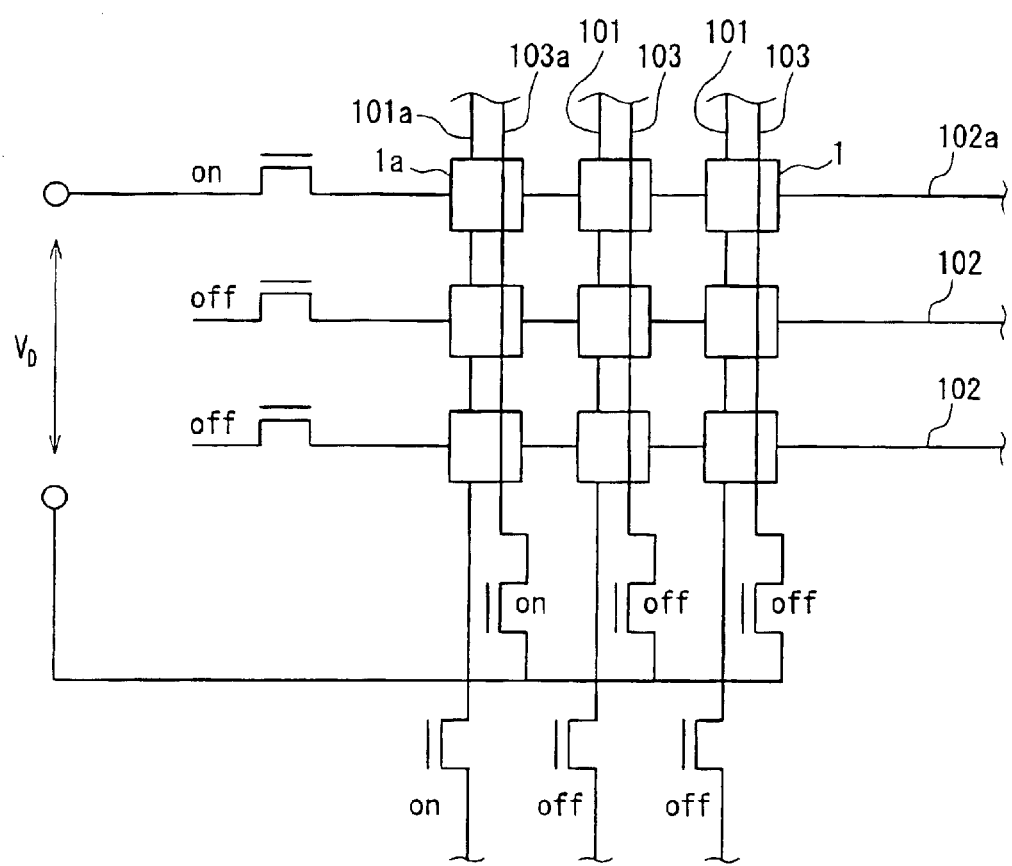
FIG. 15 is a schematic view showing an exemplary magnetic memory of the present invention.

In Example 2, magnetic memories as shown in FIGS. 13 and 15 were produced using the magnetic switching device (Sample 1) produced in Example 1, and the characteristics thereof were evaluated. As a substrate, a CMOS substrate was used, and devices were arranged in a total of 8 blocks each having 16×16 devices.

Magnetic switching devices having a film configuration of Sample 1 were produced on a CMOS substrate in the same way as in Example 1. First, FETs were placed in a matrix as switching devices on a CMOS substrate. An interlayer insulating film was placed on the FETs to flatten the surface by CMP. Thereafter, the magnetic switching devices of Sample 1 were placed in a matrix so as to correspond to the FETs. After the magnetic switching devices were placed, hydrogen sintering treatment was performed at 400° C. One device in each block was set to be a dummy device for canceling a wiring resistance, a device minimum resistance, an FET resistance, and the like. Furthermore, word lines, bit lines, and sense lines were all made of Cu, and each device size was set to be 0.5 μm×0.7 μm. As a TEOS interlayer contact layer for connecting the CMOS substrate to the magnetic switching devices, a $Pt/SrRuO_3$ layer was used.

By applying a voltage $V_g$ between the word lines and the bit lines with respect to the magnetic memory thus produced, the transition layers of 8 devices in each block were subjected to a magnetic transition, whereby a signal was recorded. Then, a gate of an FET was turned on for one device in each block, whereby a sense current was allowed to flow through the device. At this time, voltages generated in bit lines, devices and FETs in each block were compared with a dummy voltage by a comparator to read an output of each device. As a result, a device output was obtained, and it was confirmed that the magnetic memory was operable.

Furthermore, even in the case where a magnetic field was applied to the transition layer by allowing a current to flow through a sense line when $V_g$ was applied, a device output of each device was obtained, and it was confirmed that the magnetic memory was operable.

Figure 16:
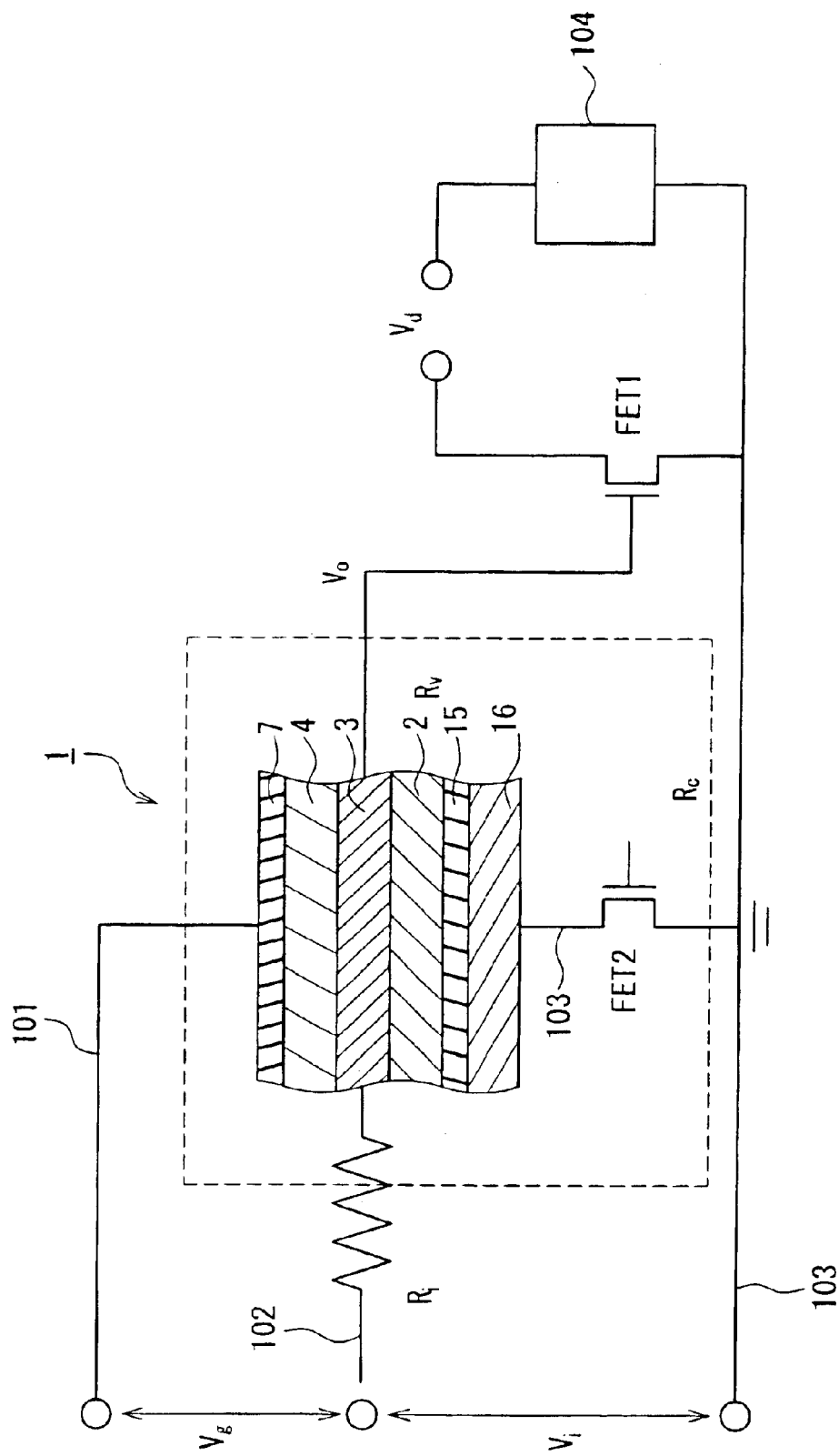
FIG. 16 is a schematic view showing an exemplary magnetic memory circuit used in an example.

Furthermore, similarly, a magnetic memory having a circuit as shown in FIG. 16 was formed. As a result, it was confirmed that a reconfigurable magnetic memory was formed using the magnetic switching device of the present invention.

In the circuit shown in FIG. 16, a basic circuit used for a programmable memory with a memory function mounted thereon, a reconfigurable memory, a programmable gate array (FPGA), or the like is adopted. In FIG. 16, $R_c$ is an ON resistance of a FET2, $R_v$ is a resistance of an MR device portion that is a detecting portion of the magnetic switching device, and $R_i$ is a wiring resistance. Herein, a voltage $V_0$ and a voltage $V_i$ generally have the following relationship:

$$V_0 = V_{ix}(R_v + R_c))/(R_i + R_v + R_c)$$

It is assumed that the resistance of the MR device portion is $R_p$ when the magnetization direction of the magnetic layer 2 is parallel to that of the fixed magnetic layer 16, the resistance thereof is $R_{vap}$ when they are antiparallel to each other, and the resistance when the magnetization directions are antiparallel to each other is larger than that when they are parallel to each other. At this time, a gate voltage $V_d$ of a load circuit 104 and the resistance of the MR device portion are expressed as follows:

$$V_d < V_0 = V_i \times (R_{vap} + R_c)/(R_i + R_{vap} + R_c),$$

and $$V_d > V_0 = V_i \times (R_{vp} + R_c)/(R_i + R_{vp} + R_c)$$

and the magnetic switching device of the present invention was able to be used as a non-volatile reconfigurable memory.

For example, in the case of using a logical circuit as the load circuit 104, the magnetic switching device of the present invention can be used as a non-volatile programmable device. Furthermore, in the case of using the load circuit 104 as a display circuit device, the magnetic switching device of the present invention can be used as a non-volatile storage device for a still image. Furthermore, a plurality of functions of these devices also can be integrated as a system LSI.

Example 3

A magnetic switching device (Sample 2) having the following film configuration was produced using pulse laser deposition (PLD). Sample 2 had the shape as shown in FIG. 12.

Sample 2

Sapphire substrate/AlN (500)/AlN:Si (100)/AlCoN:Si (10)/NiFe (10)/AlO (1)/CoFe (10)/PtMn (25)/Ta (3)/Cu (100)/Ta (25)

An AlN layer on the sapphire substrate is an insulating layer. An AlN:Si layer is a carrier supplier. An AlCoN:Si layer is a transition layer. An NiFe layer is a magnetic layer. AlO is a non-magnetic layer. A CoFe/PtMn layer is a fixed magnetic layer with an anti-ferromagnetic substance (PtMn) laminated on CoFe. The PtMn layer made of an anti-ferromagnetic substance sets the adjacent CoFe layer to be a fixed magnetic layer by magnetic coupling. A Ta/Cu/Ta laminate is an electrode on the fixed magnetic layer. This also applies to the other electrodes. An alignment constant of the sapphire substrate is (0001).

A method for producing Sample 2 will be described.

First, an AlN layer was produced on a sapphire substrate. At this time, the substrate temperature was set to be in a range of about 600° C. to about 800° C. (mainly, 650° C.). The AlN layer was produced in the same way as in Example 1. Next, an AlN:Si/AlCoN:Si multilayered film was laminated on the AlN layer under the condition that the substrate temperature was kept in a range of about 400° C. to about 600° C. (mainly, 550° C.). Then, an NiFe layer was laminated on the AlMnN:Si layer under the condition that the substrate temperature was kept in a range of room temperature to 200° C. (mainly, room temperature).

The composition ratio of the AlCoN:Si layer (i.e., the transition layer) was set to be $Al_{0.8}Co_{0.2}N$:Si. The Co amount of AlCoN was set to be about 0.001 atomic % to about 0.25 atomic %. In the case where Co was contained in the above range, the reproducibility of a paramagnetism—ferromagnetism transition separately was confirmed to be most satisfactory.

The AlCoN:Si layer exhibits paramagnetism in-a state where electrons are not injected or induced as carriers, and exhibits ferromagnetism in a state where electrons are injected or induced.

The Si doped amount in the AN:Si layer (i.e., the carrier supplier) was set to be 0.1 atomic %. The Si doped amount in the transition layer also was set to be 0.1 atomic %.

The AlO layer, the CoFe layer, and the PtMn layer were laminated in the same way as in Example 1. The device size was set to be about 1.5 $\mu$m×3 $\mu$m.

The magnetic switching device thus produced was measured for a temperature range in which the magnetoresistive effect of the detecting portion was detected in the same way as in Example 1.

As a result, it was confirmed that the magnetoresistive effect can be detected in a temperature range of 4 K to 370 K.

Next, the magnetic switching device was kept at 100 K, and a voltage was applied between the carrier supplier and the transition layer. First, in the case where a voltage (0 V to 80 V) was applied so as to increase the potential of the carrier supplier with respect to the transition layer, no change was found in the resistance of the detecting portion. When a voltage (0 V to 80 V) was applied so as to decrease the potential of the carrier supplier with respect to the transition layer, electrons moved from the carrier supplier to the transition layer, and a magnetoresistive ratio (MR ratio) of about 10% was obtained as an MR ratio, which can be considered an index of a change in the resistance of the detecting portion. The change in the resistance of the detecting portion started while a voltage of about 18 V was applied, and the largest MR ratio was obtained when a voltage of about 50 V was applied. In the region where a voltage of 50 V or more was applied, the obtained MR ratio hardly changed, and exhibited a tendency of being saturated.

Example 4

A magnetic switching device (Sample 3) having the following film configuration was produced using PLD and sputtering. Sample 3 had the shape as shown in FIG. 12.

Sample 3

Glass substrate/ITO/$Al_2O_3$ (100)/ZnNiO (15)/ZnCoO (5)/MnZnO (20)/CoFe (5)/NiFe (2)/Ru (0.7)/NiFe (5)/$AlO_x$ (1)/CoFe (15)/PtMn (25)/Ta (5)/Cu (100)/Ta (10)

An ITO (Indium Tin Oxide) layer on a glass substrate is an electrode. An $Al_2O_3$ layer is an insulating layer. A ZnNiO layer is a carrier supplier. A ZnCoO/MnZnO layer is a transition layer. A CoFe/NiFe/Ru/NiFe layer is a magnetic layer including an NiFe/Ru/NiFe layer that is a laminated ferrimagnet. $AlO_x$ is a non-magnetic layer. A CoFe/PtMn layer is a fixed magnetic layer with an anti-ferromagnetic substance (PtMn) laminated on CoFe. The PtMn layer made of an anti-ferromagnetic substance sets the adjacent CoFe layer to be a fixed magnetic layer by magnetic coupling. A Ta/Cu/Ta laminate is an electrode on the fixed magnetic layer. This also applies to the other electrodes, excluding the electrode (ITO layer) placed between the substrate and the carrier supplier.

A method for producing Sample 3 will be described First, the ITO/Al$_2$O$_3$/ZnNiO/ZnCoO/ZnMnO multilayered film was produced on the glass substrate by PLD. At this time, the substrate temperature was set to be in a range of about 450° C. to about 650° C. (mainly, 600° C.). During film formation by the PLD, a partial pressure of oxygen was set to be 1×10$^{-1}$ Torr or less. The composition ratio of the ZnNiO layer (i.e., the carrier supplier) was set to be Zn$_{0.5}$Ni$_{0.5}$O. The composition ratio of the ZnCoO/ZnMnO layer (i.e., the transition layer) was set to be Zn$_{0.75}$CO$_{0.25}$O/Zn$_{0.75}$Mn$_{0.25}$O. The ZnCoO/ZnMnO layer exhibits paramagnetism in a state where electrons are not injected or induced as carriers, and exhibits ferromagnetism in a state where electrons are injected or induced.

Then, the remaining layers including the CoFe/NiFe/Ru/NiFe layer were laminated on the ZnMoO layer by sputtering. A laminated ferrimagnet was placed for the purpose of smoothing magnetization rotation in the magnetic layer. In Sample 3, the CoFe/NiFe/Ru/NiFe/AlO$_x$/CoFe/PtMn multi-layered film constitutes an MR device portion that is a detecting portion. In Sample 3, the CoFe layer that is in contact with the ZnMnO layer also can be considered as a magnetic layer, and the NiFe/Ru/NiFe multilayered film also can be considered as a free magnetic layer. In such a case, it can be considered that the NiFe/Ru/NiFE/AlO$_x$/CoFe/PtMn multilayered film constitutes an M device that is a detecting portion.

The AlO$_x$ layer was laminated in the same way as in Example 1. The size of the device thus produced was set to be about 0.5 μm×1.5 μm. In the AlO$_x$ layer, x is a numerical value satisfying 1.2≦x≦1.6.

The magnetic switching device thus produced was measured for a temperature range in which the magnetoresistive effect of the detecting portion was detected in the same way as in Example 1.

As a result, it was confirmed that the magnetoresistive effect can be detected in a temperature range of 4 K to 370 K.

Next, the magnetic switching device was kept at 50 K, and a voltage was applied between the carrier supplier and the transition layer. First, in the case where a voltage (0 V to 180 V) was applied so as to increase the potential of the carrier supplier with respect to the transition layer, no change was found in the resistance of the detecting portion. When a voltage (0 V to 180 V) was applied so as to decrease the potential of the carrier supplier with respect to the transition layer, electrons moved from the carrier supplier to the transition layer, and a magnetoresistive ratio (MR ratio) of about 10% was obtained as an MR ratio, which can be considered an index of a change in the resistance of the detecting portion. The change in the resistance of the detecting portion started while a voltage of about 20 V was applied, and the largest MR ratio was obtained when a voltage of about 50 V was applied. In the region where a voltage of 50 V or more was applied, the obtained MR ratio hardly changed, and exhibited a tendency of being saturated.

Furthermore, in Sample 3, it was confirmed that an ITO electrode can be used as an electrode for injecting carriers. Therefore, the magnetic switching device of the present invention is considered to be also applicable to a device using a TFT (thin film transistor) material, and the like. For example, by applying the magnetic switching device of the present invention or by applying a magnetic memory using the magnetic switching device of the present invention to a matrix portion of TFT liquid crystal, matrix image information can be accumulated in a non-volatile magnetic memory portion. For example, an image display that is turned on instantly can be configured.

Example 5

A magnetic switching device (Sample 4) having the following film configuration was produced using PLD. Sample 4 had the shape as shown in FIG. 12.

Sample 4

MgO substrate/PrBa$_2$Cu$_3$O$_7$ (300)/(Sr, Ca)RuO$_3$ (50)/(Nd, Sr)$_2$ MnO$_4$ (10)/NiFe (10)/AlO (1)/CoFe (10)/PtMn (25)/T (3)/Cu (100)/Ta (25)

A PrBa$_2$Cu$_3$O$_7$ layer on a MgO substrate is an insulating layer. A (Sr, Ca)RuO$_3$ layer is a carrier supplier. A (Nd, Sr)$_2$MnO$_4$ layer is a transition layer. A NiFe layer is a magnetic layer. AlO is a non-magnetic layer. A CoFe/PtMn layer is a fixed magnetic layer with an anti-ferromagnetic substance (PtMn) laminated on CoFe. A Ta/Cu/Ta laminate is an electrode on the fixed magnetic layer. This also applies to the other electrodes. An alignment constant of the MgO substrate is (100).

A method for producing Sample 4 will be described.

First, a PrBa$_2$Cu$_3$O$_7$/(Sr, Ca)RuO$_3$/(Nd, Sr)$_2$MnO$_4$ laminate was produced on a MgO substrate. At this time, the substrate temperature was set to be in a range of about 600° C. to about 900° C. (mainly, 750° C.).

The composition ratio of the (Sr, Ca)RuO$_3$ layer (i.e., the carrier supplier) was set to be Sr$_{0.8}$Ca$_{0.2}$RuO$_3$. The composition ratio of the (Nd, Sr)$_2$MnO$_4$ layer (i.e., the transition layer) was set to be Nd$_{0.25}$Sr$_{1.75}$MnO$_4$. The (Nd, Sr)$_2$MnO$_4$ layer (i.e., the transition layer) exhibits paramagnetism in a state where holes are not injected or induced as carriers, and exhibits ferromagnetism in a state where holes are injected or induced.

The remaining layers were laminated in the same way as in Example 1. The size of the device thus produced was set to be about 1.5 μm×3 μm.

The magnetic switching device thus produced was measured for a temperature range in which the magnetoresistive effect of the detecting portion was detected in the same way as in Example 1.

As a result, it was confirmed that the magnetoresistive effect can be detected in a temperature range of 4 K to 370 K.

Next, the magnetic switching device was kept at 100 K, and a voltage was applied between the carrier supplier and the transition layer. First, in the case where a voltage (0 V to 100 V) was applied so as to increase the potential of the transition layer with respect to the carrier supplier, no change was found in the resistance of the detecting portion. When a voltage (0 V to 100 V) was applied so as to decrease the potential of the transition layer with respect to the carrier supplier, holes moved from the carrier supplier to the transition layer, and a magnetoresistive ratio (MR ratio) of about 10% was obtained as an MR ratio, which can be considered an index of a change in the resistance of the detecting portion. The change in the resistance of the detecting portion started while a voltage of about 5 V was applied, and the largest MR ratio was obtained when a voltage of about 50 V was applied. In the region where a voltage of 50 V or more was applied, the obtained MR ratio hardly changed, and exhibited a tendency of being saturated.

Furthermore, in Example 5, the magnetic switching device was produced by the PLD. However, the same effects also were obtained even in the case where the device was produced by MBE, sputtering, electron beam deposition, or the like.

Example 6

A magnetic switching device (Sample 5) having the following film configuration was produced using PLD. Sample 5 had the shape as shown in FIG. 12.

Sample 5

MgO substrate/$Pr_{0.7}Ca_{0.3}MnO_3$ (300)/$(La_{0.6}Sr_{0.4})MnO_3$ (10)/$(Nd, Sr)_2MnO_4$ (10)/NiFe (10)/AlO (1)/CoFe (10)/PtMn (25)/Ta (3)/Cu (100)/Ta (25)

A $Pr_{0.7}Ca_{0.3}MnO_3$ on a MgO substrate is an insulating layer. A $(La_{0.6}Sr_{0.4})MnO_3$ layer is a carrier supplier. A $(Nd, Sr)_2MnO_4$ layer is a transition layer. A NiFe layer is a magnetic layer. An AlO layer is a non-magnetic layer. A CoFe/PtMn layer is a fixed magnetic layer with an anti-ferromagnetic substance (PtMn) laminated on CoFe. A Ta/Cu/Ta laminate is an electrode on the fixed magnetic layer. This also applies to the other electrodes. An alignment constant of the MgO substrate is (100).

A method for producing Sample 5 will be described.

First, the $Pr_{0.7}Ca_{0.3}MnO_3/(La_{0.6}Sr_{0.4})MnOa/(Nd, Sr)_2MnO_4$ laminate was produced on the MgO substrate. At this time, the substrate temperature was set to be in a range of about 600° C. to about 900° C. (mainly, 850° C.).

The composition ratio of the (Sr, Ca)$RuO_3$ layer (i.e., the carrier supplier) was set to be $Sr_{0.8}Ca_{0.2}RuO_3$. The composition ratio of the $(Nd, Sr)_2MnO_4$ layer (i.e., the transition layer) was set to be $Nd_{0.25}Sr_{1.75}MnO_4$. The $(Nd, Sr)_2MnO_4$ layer (i.e., the transition layer) exhibits paramagnetism in a state where holes are not injected or induced as carriers, and exhibits ferromagnetism in a state where holes are injected or induced.

The remaining layers were laminated in the same way as in Example 1. The size of the device thus produced was set to be about 1.5 $\mu m \times 3$ $\mu m$ The magnetic switching device thus produced was measured for a temperature range in which the magnetoresistive effect of the detecting portion was detected in the same way as in Example 1.

As a result, it was confirmed that the magnetoresistive effect can be detected in a temperature range of 100 K to 370 K.

Next, the magnetic switching device was kept at room temperature, and a voltage was applied between the carrier supplier and the transition layer. First, in the case where a voltage (0 V to 100 V) was applied so as to increase the potential of the transition layer with respect to the carrier supplier, no change was found in the resistance of the detecting-portion. When a voltage (0 V to 100 V) was applied so as to decrease the potential of the transition layer with respect to the carrier supplier, holes moved from the carrier supplier to the transition layer, and a magnetoresistive ratio (MR ratio) of about 10% was obtained as an MR ratio, which can be considered an index of a change in the resistance of the detecting portion. The change in the resistance of the detecting portion started while a voltage of about 5 V was applied, and the largest MR ratio was obtained when a voltage of about 50 V was applied. In the region where a voltage of 50 V or more was applied, the obtained MR ratio hardly changed, and exhibited a tendency of being saturated.

Furthermore, when an applied voltage that decreases the potential of the transition layer with respect to that of the carrier supplier was set to be positive and a positive voltage and a negative voltage were applied repeatedly, an obtained MR ratio was increased/decreased repeatedly corresponding to a change in the sign of the applied voltage. It was found from this that the magnetic transition of the transition layer in Sample 5 can be controlled reversibly with a voltage applied between the carrier supplier and the transition layer.

As described above, according to the present invention, a magnetic switching device can be provided, which has a configuration different from that of a conventional example and is capable of enhancing an energy conversion efficiency for changing the magnetized state of a magnetic substance, and a magnetic memory using the magnetic switching device also can be provided.

The magnetic switching device of the present invention can be applied to, for example, a reproducing head of a magnetic recording apparatus such as an magnetooptical disk, a hard disk, a digital data streamer (DDS), a digital VTR, and the like; sensors such as a magnetic sensor for detecting a rotation speed, a stress/acceleration sensor for detecting a stress change and an acceleration change, a thermal sensor, and a chemical sensor; magnetic memories such as a magnetic random access memory (MRAM), and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetic switching device, comprising:
   a magnetic layer;
   a transition layer magnetically coupled to the magnetic layer; and
   a carrier supplier containing at least one material selected from metal and a semiconductor,
   wherein the transition layer and the carrier supplier are placed in such a manner that a voltage can be applied between the transition layer and the carrier supplier,
   the transition layer undergoes a non-ferromagnetism—ferromagnetism transition by application of the voltage, and
   a magnetized state of the magnetic layer is changed by the transition of the transition layer.

2. The magnetic switching device according to claim 1, wherein the transition layer undergoes the transition when carriers selected from electrons and holes are injected to the transition layer from the carrier supplier under the application of the voltage.

3. The magnetic switching device according to claim 1, wherein the transition layer undergoes the transition when carriers selected from electrons and holes are induced to the transition layer under the application of the voltage.

4. The magnetic switching device according to claim 1, wherein the transition is a paramagnetism—ferromagnetism transition or a non-magnetism—ferromagnetism transition.

5. The magnetic switching device according to claim 4, wherein the transition layer transitions from a paramagnetic state to a ferromagnetic state under the application of the voltage.

6. The magnetic switching device according to claim 1, wherein the transition layer is in a paramagnetic state or a non-magnetic state when the voltage is not applied thereto, and the transition layer is in a ferromagnetic state when the voltage is applied thereto.

7. The magnetic switching device according to claim 1, wherein the transition layer contains a magnetic semiconductor.

8. The magnetic switching device according to claim 1, wherein a change in the magnetized state in the magnetic layer is a change in a magnetization direction of the magnetic layer.

9. The magnetic switching device according to claim 1, wherein the transition layer, the magnetic layer, and the carrier supplier are placed so that the transition layer is interposed between the magnetic layer and the carrier supplier.

10. The magnetic switching device according to claim 1, further comprising a first insulating layer, wherein the first insulating layer is placed between the transition layer and the carrier supplier.

11. The magnetic switching device according to claim 10, wherein the transition layer and the carrier supplier are made of p-type or n-type semiconductors having different types, and
a P-I-N junction is formed among the transition layer, the first insulating layer, and the carrier supplier.

12. The magnetic switching device according to claim 1, further comprising an electrode for applying the voltage.

13. The magnetic switching device according to claim 12, wherein the carrier supplier, the transition layer, and the electrode are placed so that the carrier supplier is interposed between the electrode and the transition layer.

14. The magnetic switching device according to claim 13, further comprising a first insulating layer placed between the carrier supplier and the electrode.

15. The magnetic switching device according to claim 1, further comprising a magnetic field generating portion for applying a magnetic field to at least one layer selected from the transition layer and the magnetic layer.

16. The magnetic switching device according to claim 15, wherein the magnetic field generating portion is placed so that at least one layer selected from the transition layer and the magnetic layer is interposed between the magnetic field generating portion and the carrier supplier.

17. The magnetic switching device according to claim 15, wherein the magnetic field generating portion includes at least one selected from a ferromagnetic substance, a coil, and a lead.

18. The magnetic switching device according to claim 1, further comprising a detecting portion for detecting a change in a magnetized state of the magnetic layer.

19. The magnetic switching device according to claim 18, wherein the detecting portion includes a magnetoresistive device including a non-magnetic layer, and a free magnetic layer and a fixed magnetic layer placed so as to interpose the non-magnetic layer therebetween, the magnetic layer and the free magnetic layer are magnetically coupled to each other, and a resistance of the magnetoresistive device is varied when a magnetized state of the free magnetic layer is changed along with a change in a magnetized state of the magnetic layer.

20. The magnetic switching device according to claim 18, wherein the detecting portion includes a fixed magnetic layer and a non-magnetic layer, the fixed magnetic layer and the non-magnetic layer are placed so that the non-magnetic layer is interposed between the magnetic layer and the fixed magnetic layer, the magnetic layer, the non-magnetic layer, and the fixed magnetic layer constitute a magnetoresistive device, and a resistance of the magnetoresistive device is varied by a change in a magnetized state of the magnetic layer.

21. A magnetic memory, comprising: a plurality of the magnetic switching devices of claim 18; an information recording lead for recording information in the magnetic switching device; and an information reading lead for reading the information.

* * * * *